United States Patent [19]

Yamamoto et al.

[11] Patent Number: 5,736,776
[45] Date of Patent: Apr. 7, 1998

[54] SEMICONDUCTOR DEVICE AND METHOD OF MANUFACTURING THE SAME

[75] Inventors: Fumitoshi Yamamoto; Tetsuo Higuchi, both of Hyogo, Japan

[73] Assignee: Mitsubishi Denki Kabushiki Kaisha, Tokyo, Japan

[21] Appl. No.: 393,644

[22] Filed: Feb. 24, 1995

[30] Foreign Application Priority Data

Mar. 1, 1994 [JP] Japan .................. 6-031564

[51] Int. Cl.$^6$ .................................................. H01L 29/00
[52] U.S. Cl. .................. 257/532; 257/751; 257/756; 257/757; 257/915
[58] Field of Search .................. 257/532, 300, 257/641, 649, 751, 755–757, 915

[56] References Cited

U.S. PATENT DOCUMENTS

| | | | |
|---|---|---|---|
| 3,387,286 | 6/1968 | Denmaid | 365/185 |
| 4,329,706 | 5/1982 | Crowder et al. | 257/755 |
| 4,784,973 | 11/1988 | Stevens et al. | 257/751 |
| 4,897,702 | 1/1990 | Sunouchi | 257/311 |
| 4,931,845 | 6/1990 | Ema | 257/755 |
| 5,187,122 | 2/1993 | Bonis | 257/532 |

FOREIGN PATENT DOCUMENTS

| | | |
|---|---|---|
| 0603101 | 6/1994 | European Pat. Off. . |
| 0614218 | 9/1994 | European Pat. Off. . |
| 4137081 | 6/1992 | Germany . |
| 63-64356 | 3/1988 | Japan . |
| 64-22054 | 1/1989 | Japan . |
| 2-284429 | 11/1990 | Japan . |
| 3-30431 | 2/1991 | Japan . |

*Primary Examiner*—J. Carroll
*Attorney, Agent, or Firm*—Lowe, Price, LeBlanc & Becker

[57] ABSTRACT

On a p$^+$ diffused region which is to be a lower electrode of a capacitor, a silicon nitride film which is a capacitor insulating layer is formed. An upper electrode is formed on this silicon nitride film. The upper electrode has a non-doped polycrystalline silicon film and a silicide layer. Non-doped polycrystalline silicon film is formed in contact with silicon nitride film. Silicide layer is formed on a surface of non-doped polycrystalline silicon film. Thus, a capacitor structure is obtained in which a larger capacitance and a higher breakdown voltage can be assured, so that it would not operate inaccurately even when it is integrated to a higher degree.

10 Claims, 28 Drawing Sheets

EXPERIMENT SAMPLE(A)

EXPERIMENT SAMPLE(B)

EXPERIMENT SAMPLE(C)

SEMICONDUCTOR DEVICE AND METHOD OF MANUFACTURING THE SAME

BACKGROUND OF THE INVENTION

1. Field of the invention

The present invention relates to a semiconductor device and a method of manufacturing the same, and more particularly to a semiconductor device having a capacitor and a method of manufacturing the same.

2. Description of the Background Art

Structure and manufacturing method of a conventional semiconductor device having a capacitor will be described first.

FIG. 39 is a schematic cross sectional view showing the structure of the conventional semiconductor device. Referring to FIG. 39, an $n^+$ diffused region 419 is formed on a surface of a p type silicon substrate 417. On this $n^+$ diffused region 419, an epitaxial 421 is formed. A $p^+$ diffused region 423 for element isolation is formed to surround a side surface of this epitaxial layer 421.

On a surface of these epitaxial layer 421 and $p^+$ diffused region 423, an element isolating oxide film 415a and a silicon oxide film 415b are formed.

A $p^+$ diffused region 401b which is to be a lower electrode of a capacitor is formed on the surface of epitaxial layer 421. An opening 415c is provided in silicon oxide film 415b, reaching a portion of a surface of this $p^+$ diffused region 401. A silicon nitride film 403 which is to be a capacitor insulating layer is formed, so as to be in contact with $p^+$ diffused region 401 through this opening 415c. A polycrystalline silicon film 405 to which an impurity is introduced (hereinafter referred to as doped polycrystalline silicon film) is formed to be opposite to $p^+$ diffused region 401, with this silicon nitride film 403 therebetween. This doped polycrystalline silicon film 405 will be an upper electrode of the capacitor.

Electric charges are stored at the portion where $p^+$ diffused region 401 and doped polycrystalline silicon film 405 are opposite to one another, forming the capacitor.

An interlayer insulating film 413 consisting of a silicon oxide film or the like is formed entirely over the surface, covering doped polycrystalline silicon film 405 which is to be the upper electrode. In this interlayer insulating film 413, a contact hole 413a exposing a portion of a surface of doped polycrystalline silicon film 405 and a contact hole 413b exposing a portion of a surface of $p^+$ diffused region 401 are formed. Aluminum layers 411 are formed respectively to be in contact with doped polycrystalline silicon film 405 or $p^+$ diffused region 401 through each of these contact holes 413a and 413b.

Manufacture of the conventional semiconductor device shown in FIG. 39 together with a bipolar transistor will now be described.

FIGS. 40 to 45 are schematic cross sectional views showing a method of manufacturing the conventional semiconductor device, in order of the steps performed. Referring first to FIG. 40, antimony (Sb) or the like is implanted to a predetermined surface of p type silicon substrate 417. Thereafter, heat treatment is effected thereby forming an $n^+$ diffused region 419. An epitaxial layer 421 is formed entirely on a surface of p type silicon substrate 417. In this way, a structure is obtained in which $n^+$ diffused region 419 is buried between p type silicon substrate 417 and epitaxial layer 421.

Then, an element isolating oxide film 415a is formed at a predetermined region of a surface of epitaxial layer 421 by LOCOS (Local Oxidation of Silicon). At the same time, a thin silicon oxide film 415b is also formed.

Thereafter, a p type impurity is implanted to a predetermined region which is isolated by element isolating oxide film 415a and heat treatment is performed. In this way, $p^+$ diffused region 423 for element isolation is formed at a predetermined region of epitaxial layer 421.

Thereafter, boron is implanted to a predetermined region of epitaxial layer 421. Then, heat treatment is effected thereby forming $p^+$ diffused regions 401 and 425 at the surface of epitaxial layer 421, which $p^+$ diffused region 401 formed as lower electrode of the capacitor and $p^+$ diffused region 425 as a base region of the bipolar transistor.

Referring to FIG. 41, an opening 415c is formed in silicon oxide film 415b by photolithograhpy, exposing a portion of a surface of $p^+$ diffused region 401. The opposing area of the capacitor is determined by the area of this opening 415c. Silicon nitride film 403 is deposited entirely on the surface so as to be in contact with $p^+$ diffused region 401 via this opening 415c. Doped polycrystalline silicon film 405 is formed entirely on the surface of this silicon nitride film 403. These silicon nitride film 403 and doped polycrystalline silicon film 405 are patterned by photolithography. In this way, capacitor insulating layer 403 and upper electrode 405 of the capacitor are formed, respectively.

Referring to FIG. 42, interlayer insulating film 413 consisting of silicon oxide film or the like is formed entirely on the surface to cover upper electrode 405. Planarization is effected to this interlayer insulating film 413 so that its upper surface will be planar.

Referring to FIG. 43, a resist pattern 450a having a desired shape is formed on the surface of planarized interlayer insulating film 413. Using this resist pattern 450a as a mask, interlayer insulating film 413 and a silicon oxide film 415b are etched away. Thus, contact hole 413a exposing a portion of a surface of upper electrode 405, contact hole 413b exposing a portion of a surface of $p^+$ diffused region 401 which is to be the lower electrode, a contact hole 413c exposing a portion of a surface of expitaxial layer 421, together with contact holes 413d and 413e exposing portions of a surface of $p^+$ diffused region 425 are formed, respectively. Resist pattern 450a is then removed.

Referring to FIG. 44, a resist pattern 450b is formed so as to fill contact holes 413a, 413b and 413d. Under this condition, ions of As (arsenic) are implanted through contact holes 413c and 413e. Resist pattern 450b is then removed.

Referring to FIG. 45, heat treatment is performed, resulting in diffusion and activation of ions implanted through contact holes 413c and 413e. This forms an $n^+$ diffused region 427 which is to be a collector at the surface of epitaxial layer 421 and an $n^+$ diffused region 429 which is to be an emitter at the surface of $p^+$ base diffused region 425. Thereafter, aluminum layer 411 is formed entirely on the surface by sputtering. This aluminum layer 411 is patterned by photolithography to form interconnection layer 411 which is in contact with the underlying layers via contact holes 413a, 413b, 413c, 413d, and 413e, respectively.

To increase degree of integration of the device, it is necessary to reduce the area of the surface that is occupied by each device. However, when the two-dimensional occupation area of the capacitor is reduced, the opposing area of the capacitor electrodes is made smaller, resulting in the reduction of capacitor capacitance. If this capacitance is reduced below a certain value, the IC (Integrated Circuit) is likely to operate inaccurately.

As a means to increase the capacitance of the capacitor with the same two-dimensional occupation area, the capacitor insulating layer between the capacitor electrodes may be made thinner. However, if the capacitor insulating layer is made thin, breakdown voltage between the capacitor electrodes will be decreased.

In general, various voltages such as 5V and 12V are used for an internal voltage of an IC. Considering that search voltage may be applied to the device used for an IC, a breakdown voltage which is at least two times as high as this internal voltage of the IC is needed.

If breakdown voltage between the capacitor electrodes becomes lower than two times the IC internal voltage, there will be a leak current between the electrodes, causing an inaccurate operation of the IC.

In the structure of the capacitor of the conventional semiconductor device, the capacitance and the breakdown voltage was not sufficient when further increase in the integration level was taken into consideration, meaning that when the device is integrated to a higher degree, the operation could be inaccurate.

SUMMARY OF THE INVENTION

It is an object of the present invention to provide a capacitor structure and a method of manufacturing the same, in which larger capacitance and higher breakdown voltage can be ensured while preventing inaccurate operations even when degree of integration is increased.

The semiconductor device of the present invention includes a lower electrode layer, a capacitor insulating layer, and an upper electrode layer. The capacitor insulating layer is formed on the lower electrode layer. The upper electrode layer is formed on the capacitor insulating layer so that it is insulated from the lower electrode layer. In addition, the upper electrode layer has a polycrystalline silicon layer which is in contact with the capacitor insulating layer, and a silicide layer formed on the polycrystalline silicon layer.

The inventors of the present invention have found through intensive study that if an upper electrode layer of the capacitor has a polycrystalline silicon layer and a silicide layer, capacitance and breakdown voltage of the resulting capacitor would be superior to those of the conventional capacitor.

In the semiconductor device of the present invention, the upper electrode layer which forms the capacitor has the polycrystalline silicon layer in contact with the capacitor insulating layer, and the silicide layer formed on the polycrystalline silicon layer. Thus, a capacitor with capacitance and breakdown voltage which are superior to those of the conventional capacitor can be obtained. Accordingly, a capacitor which is not likely to perform an inaccurate operation can be obtained, even when the device is integrated to a higher degree.

A semiconductor device in accordance with one preferred aspect of the present invention additionally includes a semiconductor substrate having a main surface. In addition, a lower electrode layer has a second polycrystalline silicon layer to which an impurity is introduced, and is formed on the main surface of the semiconductor substrate.

In the semiconductor device in accordance with the preferred aspect of the present invention, the lower electrode layer has the second polycrystalline silicon layer into which an impurity is introduced. The second polycrystalline silicon layer to which an impurity is introduced is mainly formed in the same process as an interconnection layer or the like. Since lower interconnection resistance is preferred in interconnection layer or the like, impurity can be implanted into the second polycrystalline silicon layer to a maximum extent. Since high impurity concentration in the second polycrystalline silicon layer is allowed, formation of a depletion layer at the lower electrode layer is prevented even when a high voltage is applied between the upper and lower electrodes. Accordingly, a large capacitance of the capacitor can be maintained even when a high voltage is applied between the electrodes.

In a semiconductor device in accordance with another preferred aspect of the present invention, a lower electrode layer has a second silicide layer formed on a second polycrystalline silicon layer to which an impurity is introduced.

In the semiconductor device in accordance with this another preferred aspect of the present invention, since the lower electrode layer is formed of the second polycrystalline silicon layer to which an impurity is introduced and the second silicide layer, sheet resistance value for the entire lower electrode layer can be set low compared to an electrode layer formed of a single layer of doped polycrystalline silicon film. Accordingly, a capacitor which can contribute further to the increase in its capacitance can be obtained.

In a semiconductor device in accordance with still another preferred aspect of the present invention, a capacitor insulating layer has a silicon nitride film and a first silicon oxide film formed on the silicon nitride film.

In the semiconductor device in accordance with the still another preferred aspect of the present invention, the capacitor insulating layer has the silicon nitride film and the first silicon oxide film. The specific dielectric constant of the silicon nitride film is higher than that of the silicon oxide film. Therefore, when silicon nitride film is employed for the capacitor insulating layer, a higher capacitance can be obtained, compared to silicon oxide film. On the other hand, occurrence of leak current is less likely with silicon oxide film compared to silicon nitride film. Accordingly, when silicon oxide film is employed for the capacitor insulating layer, a higher capacitor breakdown voltage can be obtained, compared to silicon nitride film. Therefore, the capacitor insulating layer having the silicon nitride film and the first silicon oxide film can provide a capacitor having large capacitance and high capacitor breakdown voltage.

In a semiconductor device in accordance with a still another preferred aspect of the present invention, a capacitor insulating layer has a second silicon oxide film formed between a lower electrode layer and a silicon nitride film.

In the semiconductor device in accordance with this still another aspect of the present invention, the capacitor insulating layer has the second silicon oxide film formed between the lower electrode layer and the silicon nitride film, so that the first silicon oxide film can prevent generation of leak current at the periphery of the upper electrode layer while the second oxide film prevents generation of leak current at the periphery of the lower electrode layer. Accordingly, a capacitor with an even more superior capacitor breakdown voltage can be obtained.

A semiconductor device in accordance with a still another preferred aspect of the present invention is provided with an additional interconnection layer connected to an upper electrode layer. The interconnection layer has a barrier layer connected electrically to the silicide layer and a layer including aluminum. The barrier layer is formed between the silicide layer and the layer including aluminum.

In the semiconductor device in accordance with the still another preferred aspect of the present invention, since the interconnection layer has the barrier layer formed between the silicide layer and the layer including aluminum, alloy spikes caused by direct contact of the layer including aluminum and the layer including silicon can be prevented.

A method of manufacturing a semiconductor device in accordance with the present invention includes the following steps.

First, a lower electrode layer is formed. A capacitor insulating layer is formed on the lower electrode layer. Then, an upper electrode layer is formed on the capacitor insulating layer so that it is insulated from the lower electrode layer. The step of forming this upper electrode layer has the step of forming a polycrystalline silicon layer so that it is in contact with the capacitor insulating layer and the step of forming a silicide layer on the polycrystalline silicon layer.

In the method of manufacturing the semiconductor device in accordance with the present invention, a capacitor with superior capacitance and breakdown voltage can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In order to obtain a capacitor with improved capacitance and breakdown voltage, inventors of the present invention have performed the following experiment.

Figure 1A:
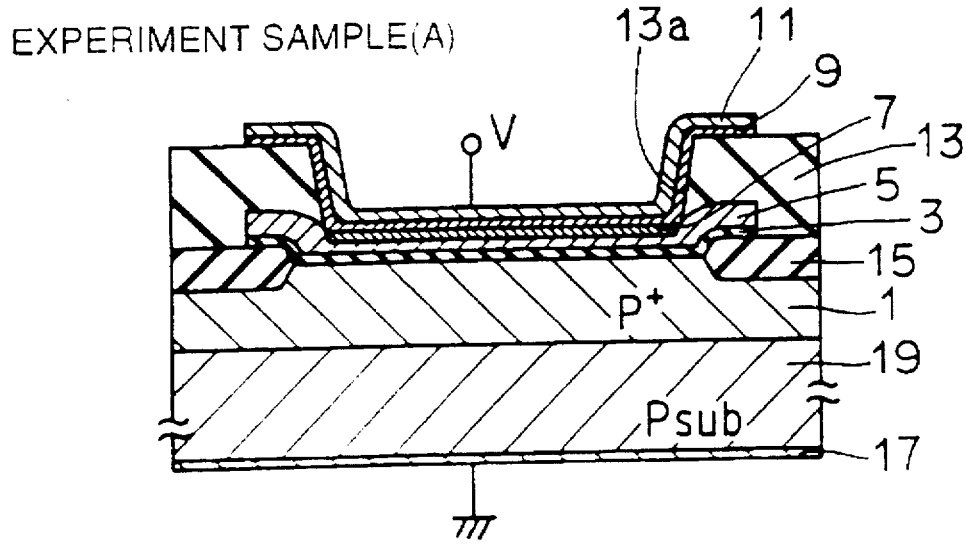
FIGS. 1A and 1B are schematic cross sectional views showing the structure of experiment samples (A) and (B).
Figure 1B:
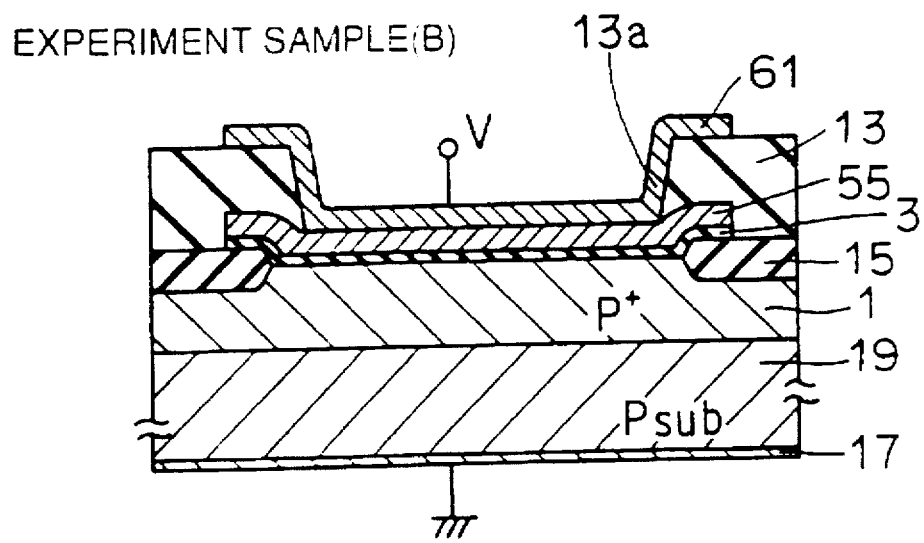

First, experiment samples (A) and (B) as shown in FIGS. 1A and 1B were prepared. Referring to FIG. 1A, an upper electrode of the capacitor in experiment sample (A) is formed of a polycrystalline silicon film to which no impurity is introduced (hereinafter referred to as non-doped polycrystalline silicon film) and a silicide film.

More specifically, a $p^+$ diffused region 1 which is to be a lower electrode is formed on a surface of p type silicon substrate 19. A capacitor insulating layer 3 including silicon nitride film ($Si_3N_4$) is formed to be in contact with a surface of this $p^+$ diffused region 1 which is isolated by an element isolating film 15. On this capacitor insulating layer 3, the upper electrode including a non-doped polycrystalline silicon film 5 and a titanium silicide ($TiSi_2$) layer 7 is formed.

Covering this upper electrode 5, 7, an insulating film 13 consisting of silicon oxide film is formed. An opening 13a is formed in this insulating film 13, reaching a portion of a surface of titanium silicide layer 7. A titanium nitride (TiN) film 9 is formed to be in contact with titanium silicide layer 7 through this opening 13a. An aluminum silicon (AlSi) film 11 is formed on a surface of this titanium nitride film 9.

In addition, a conductive layer 17 of a triple-layered structure consisting of titanium, nickel, and gold (Ti/Ni/Au) is formed on a rear surface of p type silicon substrate 19.

The $p^+$ diffused region 1 which is to be the lower electrode is set so that ρ (sheet resistance)=40Ω/□. Non-doped polycrystalline silicon film 5 of the upper electrode is formed to have a thickness of 1500 Å, while titanium silicide film 7 is formed to have a thickness of 650 Å. In addition, titanium nitride layer 9 and aluminum silicon film 11 are formed to have a thickness of 1000 Å and a thickness of 6500 Å, respectively.

Referring next to FIG. 1B, an upper electrode constituting a capacitor is formed of a single layer of doped polycrystalline silicon film in experiment sample (B).

More specifically, the upper electrode of experiment sample (B) is formed of a single layer of doped polycrystalline silicon film 55 having film thickness of 1500 Å. An interconnection layer is of a single layer of aluminum silicon film 61 having a thickness of 6500 Å.

To doped polycrystalline silicon film 55 which constitutes the upper electrode, phosphorus (P) is introduced so that sheet resistance will be ρ=25±3Ω/□ after the formation of non-doped polycrystalline silicon film.

Since the structure of this sample is mostly similar to that of the experiment sample (A) except for these upper electrode and interconnection layer, further description is not given.

Breakdown voltage and capacitance of respective experiment samples (A) and (B) having structures described above were measured.

The measurement of breakdown voltage and capacitance was performed in the following manner.

First, a conductive layer 17 which is formed at the rear surface of p type silicon substrate 19 was connected to the ground, and voltage was applied to aluminum silicon film 11 or 61. At this time, the value I of leak current flowing through capacitor insulating layer 3 was measured. Then, applied voltage and capacitance in the capacitor when leak current value I is 100 PA were measured.

As for experiment sample (A), film thickness of capacitor insulating layer 3 was set at 200 Å, 300 Å and 600 Å, and applied voltage (capacitor breakdown voltage) and capacitance for each film thickness were measured.

As for experiment sample (B), film thickness of capacitor insulating layer 3 was set at 100 Å, 200 Å and 300 Å, and applied voltage (capacitor breakdown voltage) and capacitance for each film thickness were measured.

Figure 2:
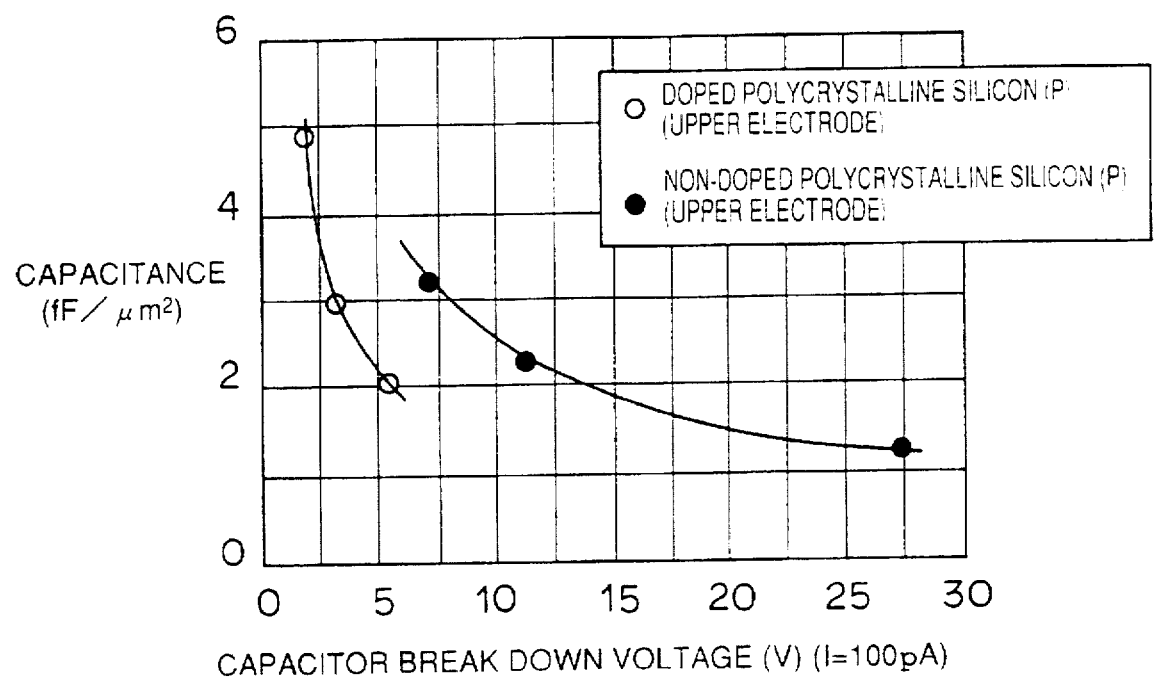
FIG. 2 is a graph showing capacitor breakdown voltage and capacitance of the experiment samples (A) and (B).

The result of the above measurement is shown in FIG. 2. Referring to FIG. 2, it can be seen that experiment sample (A) represented by ● is superior to experiment sample (B) represented by ○ in capacitor breakdown voltage and capacitance. The result of this experiment is described in the following.

In the conventional capacitor structure, the upper electrode is made of doped polycrystalline silicon film. Impurity in this doped polycrystalline silicon film is diffused within the capacitor insulating layer owing to the subsequent heat treatment, resulting in deterioration of film quality of the capacitor insulating layer, such that capacitance and breakdown voltage is decreased.

In addition, grain size of the doped polycrystalline silicon film is generally larger than that of the non-doped polycrystalline silicon film. Accordingly, when doped polycrystalline silicon film is used for the upper electrode, electric field of the upper electrode would not be even, if electric charges or the like are stored in the capacitor. As a result, capacitance and breakdown voltage of the capacitor would be decreased.

Based upon the results of the experiment described above, it is made clear that by using a stacked structure of non-doped polycrystalline silicon film and silicide layer for the upper electrode of the capacitor, capacitor with better breakdown voltage and capacitance is obtained as compared to an upper electrode of a doped-polycrystalline silicon film.

Each of the embodiments according to the present invention in the following is based on the above findings.

Embodiment 1

Figure 3:
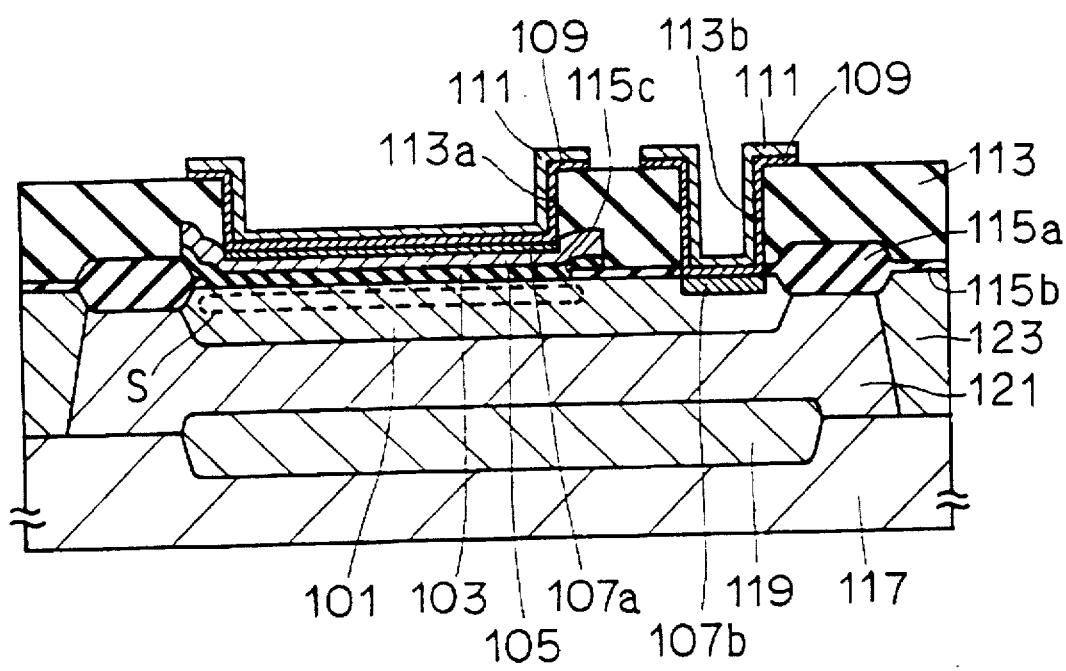
FIG. 3 is a schematic cross sectional view showing a structure of a semiconductor device in a first embodiment in accordance with the present invention.
Figure 39:
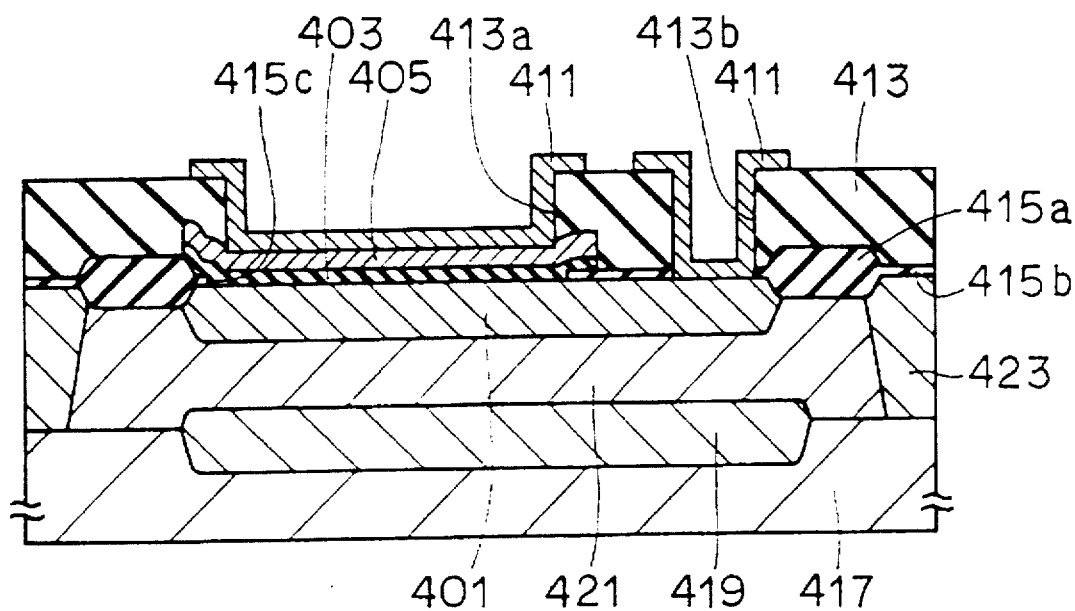
FIG. 39 is a schematic cross sectional view showing a structure of a conventional semiconductor device.

Referring to FIG. 3, a semiconductor device in accordance with the present embodiment is different from the conventional example shown in FIG. 39 in the structure of an upper electrode which constitutes the capacitor and in the structure of an interconnection layer.

The upper electrode has a non-doped polycrystalline silicon film 105 which is in contact with a capacitor insulating layer 103 and a silicide layer 107a consisting of, for example, titanium silicide ($TiSi_2$), which is formed on this non-doped polycrystalline silicon film 105.

The interconnection layer has a barrier layer 109 which is in contact with silicide layer 107a through opening 113a and an aluminum layer 111 formed on this barrier layer 109. This barrier layer 109 is, for example, of titanium nitride (TiN). At the region where barrier layer 109 is in contact with a p$^+$ diffused region 101, a silicide layer 107b of, for example, titanium silicide is formed.

Capacitor insulating layer 103 is not limited to a single layer of silicon nitride layer; it may also be of a stacked structure of silicon nitride film and silicon oxide film. Also, aluminum layer 111 may be formed of an aluminum silicon layer.

Manufacture of the semiconductor device according to the present embodiment together with a bipolar transistor will now be described.

Figure 40:
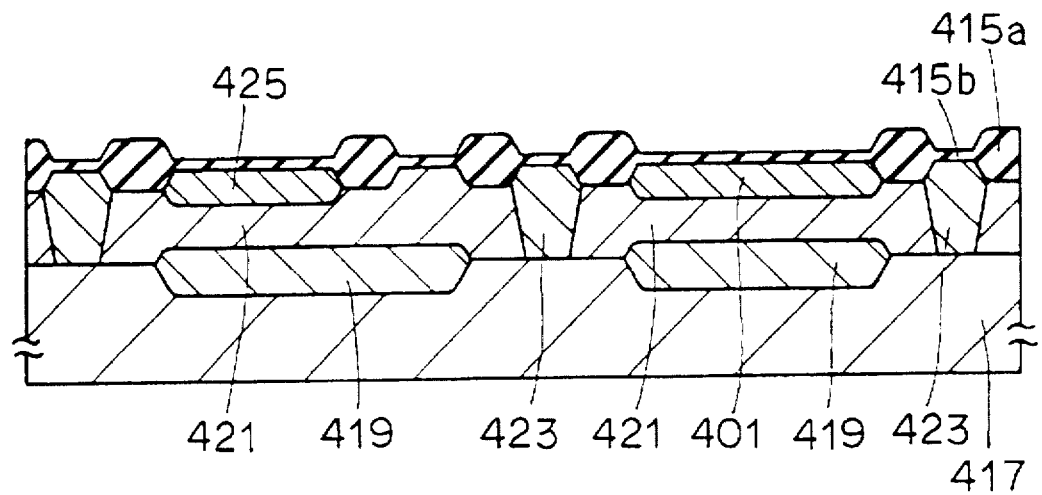
FIGS. 40 to 45 are schematic cross sectional views showing a method of manufacturing the conventional semiconductor device in order of the steps.
Figure 41:
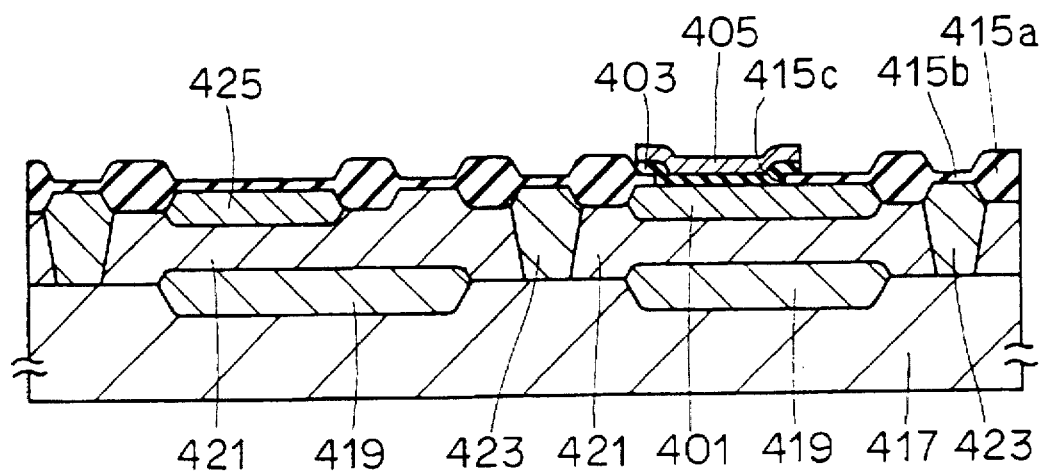
Figure 42:
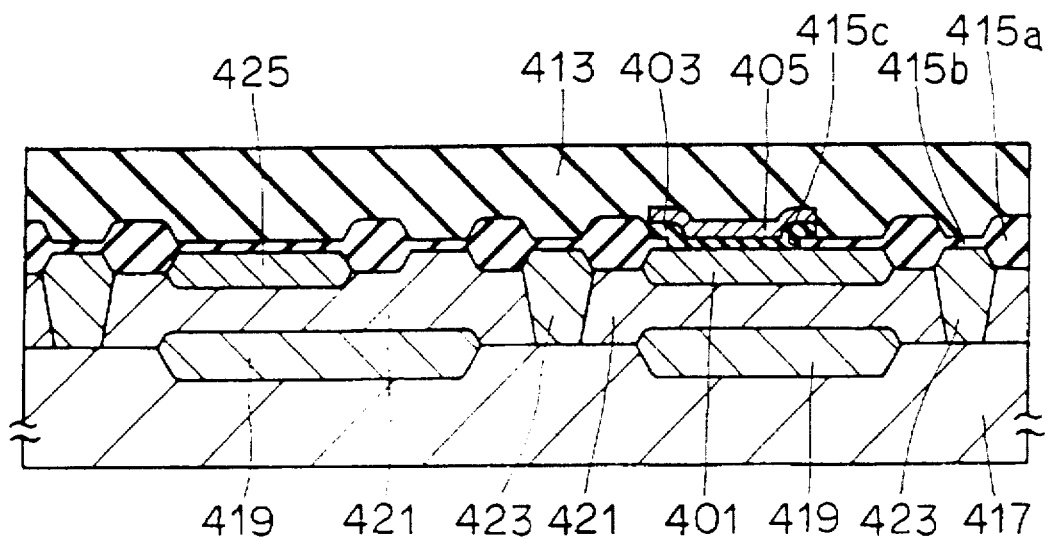
Figure 43:
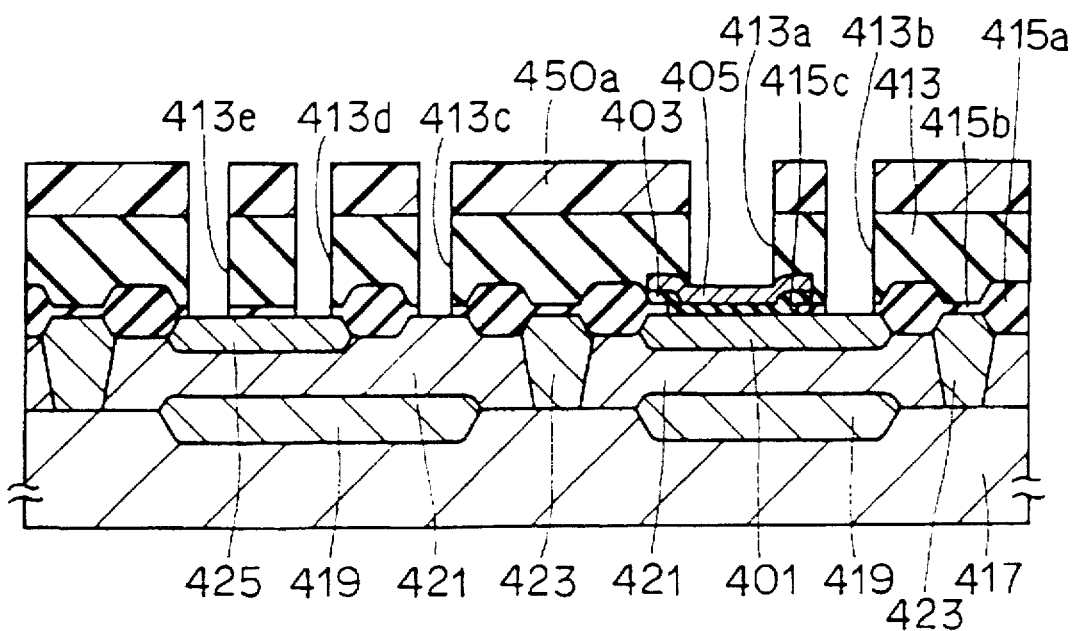
Figure 44:
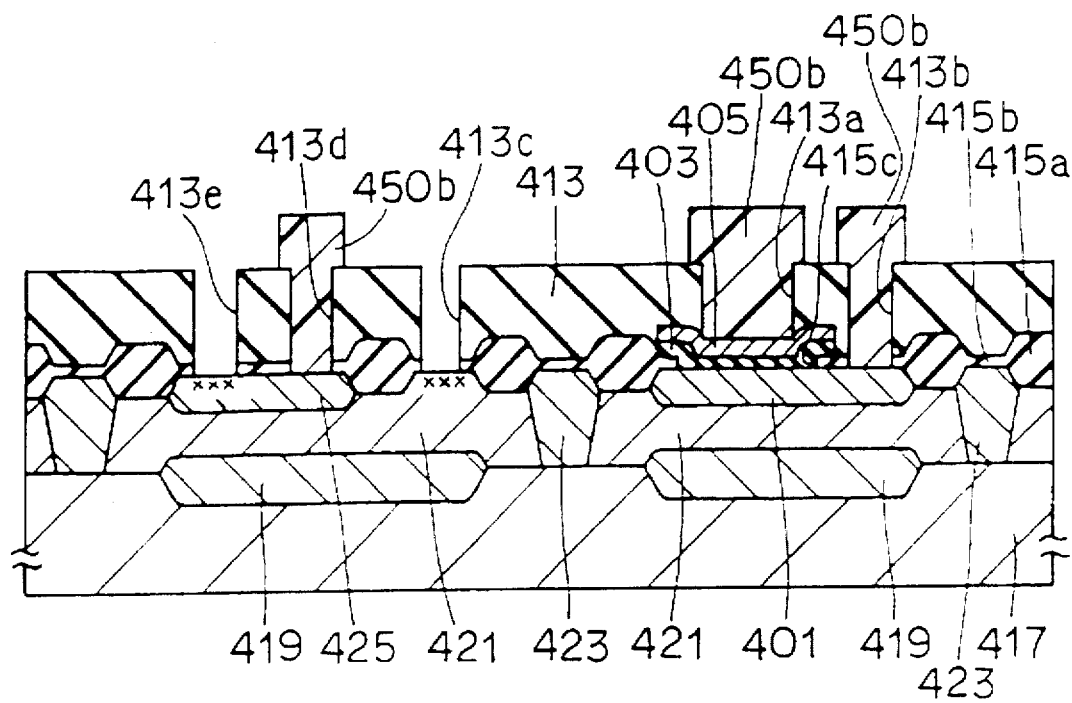
Figure 45:
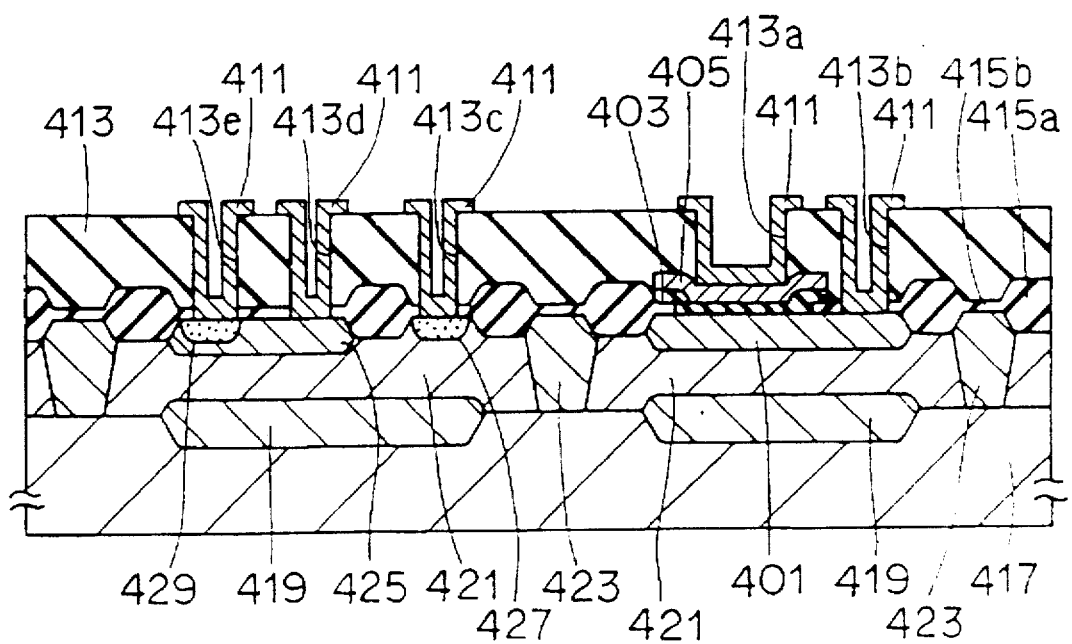

First, a manufacturing method of the present embodiment is performed by a process as in the conventional method shown in FIG. 40.

Figure 4:
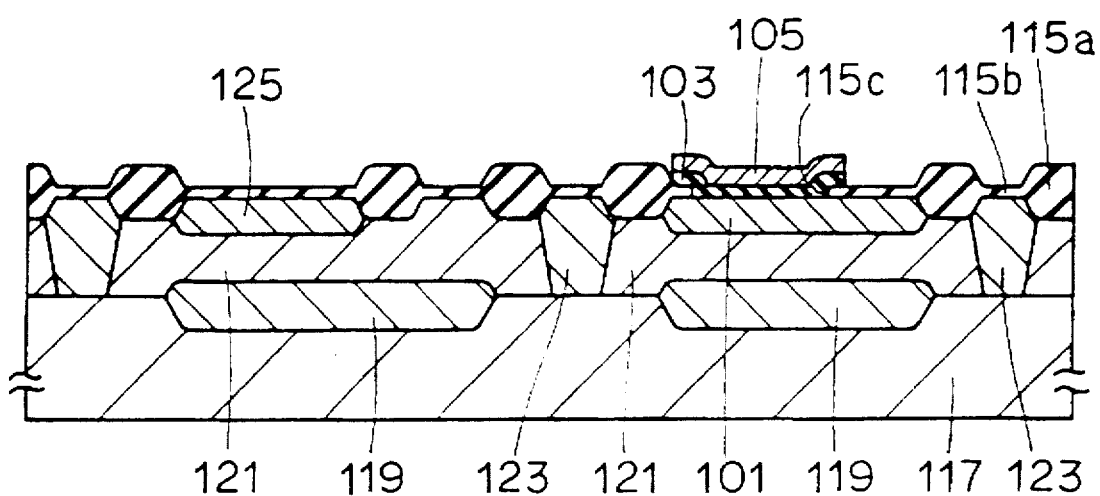
FIGS. 4 to 10 are schematic cross sectional views showing a method of manufacturing the semiconductor device of the first embodiment in accordance with the present invention in order of the steps.

Referring next to FIG. 4, an opening 115c is formed in a silicon oxide film 115b by photolithography such that a portion of a surface of p$^+$ diffused region 101 which is to be the lower electrode is exposed. Silicon nitride film 103 is formed entirely on the surface so as to be in contact with a portion of a surface of p$^+$ diffused region 101 through this opening 115c. On the entire surface of this silicon nitride film 103, non-doped polycrystalline silicon film 105 is formed by CVD (Chemical Vapor Deposition), for example. Thereafter, non-doped polycrystalline silicon film 105 and silicon nitride film 103 are patterned to a desired shape by photolithography.

Figure 5:
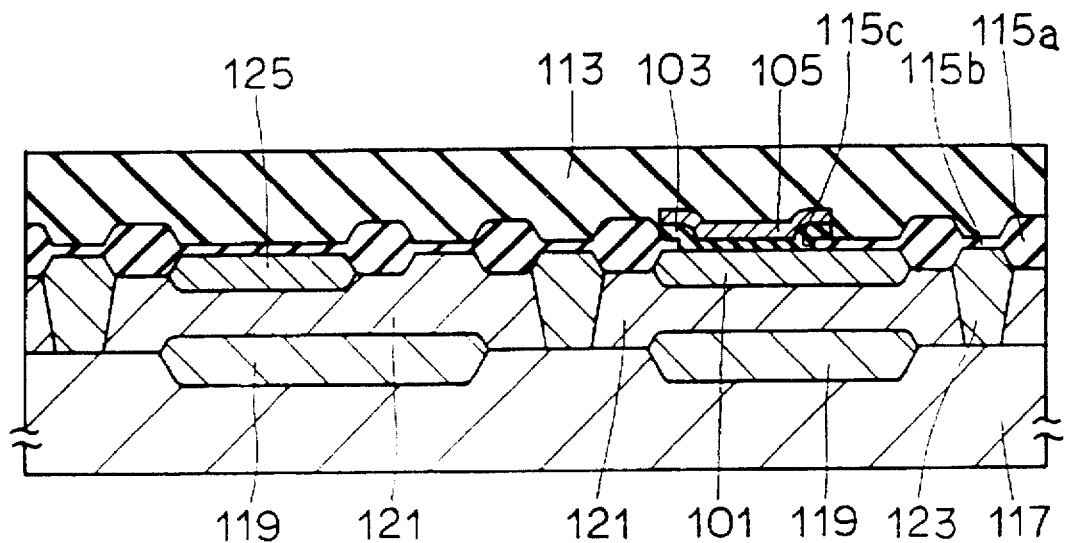

Referring to FIG. 5, a silicon oxide film 113 is formed to cover non-doped polycrystalline silicon film 105. Planarization is performed on this silicon oxide film 113 thereby forming interlayer insulting film 113 with a planarized upper surface.

Figure 6:
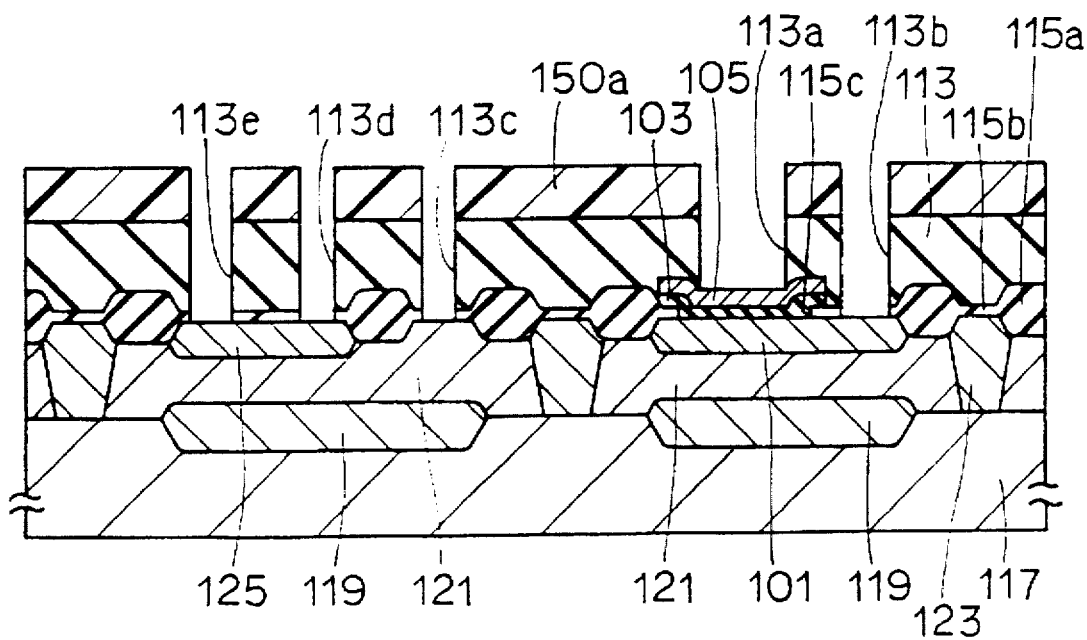

Referring to FIG. 6, a resist pattern 150a having a desired shape is formed on a surface of interlayer insulating film 113. Using this resist pattern 150a as a mask, interlayer insulating film 113 and silicon oxide film 115b are etched anisotropically. By this etching, contact hole 113a exposing a portion of a surface of non-doped polycrystalline silicon film 105, a contact hole 113b exposing a portion of a surface of a p$^+$ diffused region 101, a contact hole 113c exposing a portion of a surface of an epitaxial layer 121, and contact holes 113d and 113e exposing portions of a surface of a p$^+$ diffused region 125 are formed, respectively. Resist pattern 150a is then removed.

Figure 7:
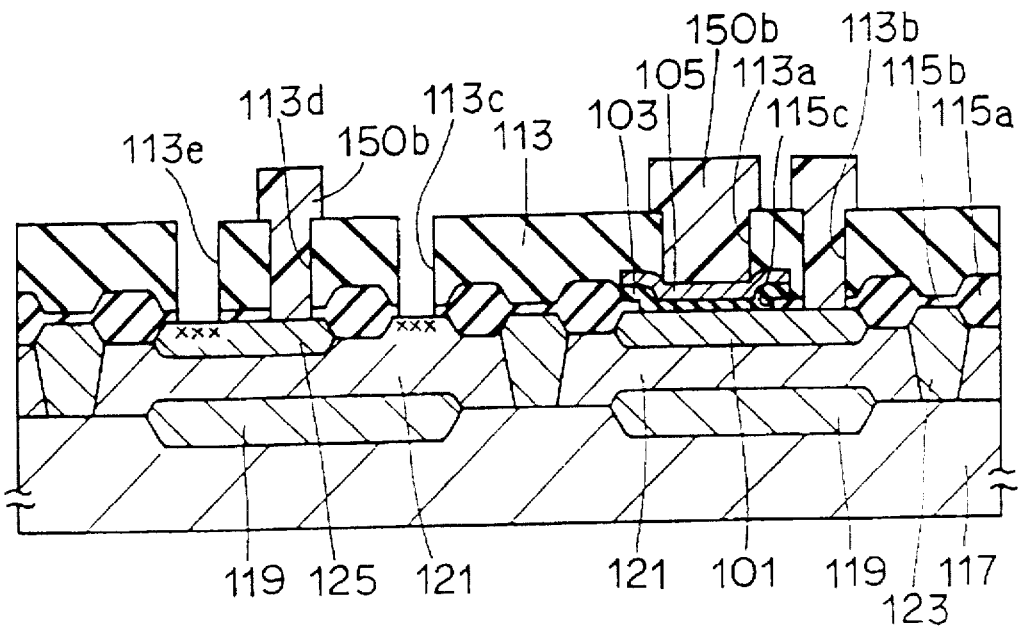

Referring to FIG. 7, each of the contact holes 113a, 113b, and 113d are filled by a resist pattern 150b. Under this condition, an n type impurity such as arsenic is implanted through contact holes 113c and 113e. Resist pattern 150b is then removed.

Figure 8:
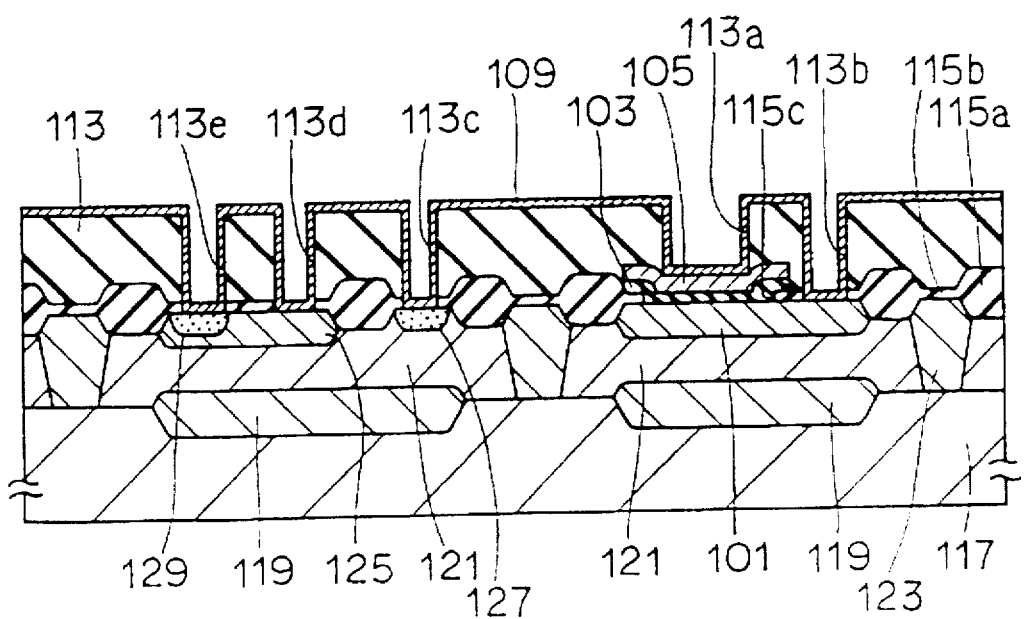

Referring to FIG. 8, the implanted n type impurity is diffused and activated by performing a heat treatment at a temperature of 1050° C. in nitrogen atmosphere for 20 minutes. This leads to the formation of an n type collector region 127 on a surface of epitaxial layer 121 and an n type emitter region 129 on a surface of p$^+$ diffused region 125, respectively. Thereafter, titanium (Ti) film 109 is formed entirely on the surface by sputtering.

Figure 9:
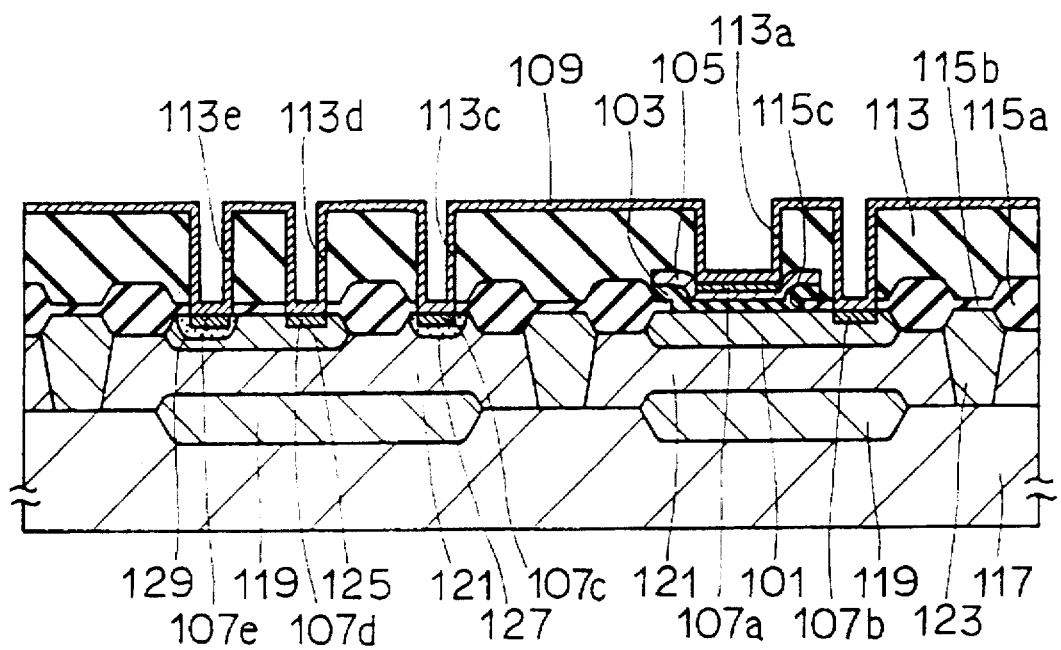

Referring to FIG. 9, annealing is performed at a temperature of 820° C. in nitrogen atmosphere for 30 seconds. As a result, titanium silicide layers 107a, 107b, 107c, 107d, and 107e are formed at portions where titanium film 109 is in contact with silicon. Other portions are turned to titanium nitride layer 109.

Figure 10:
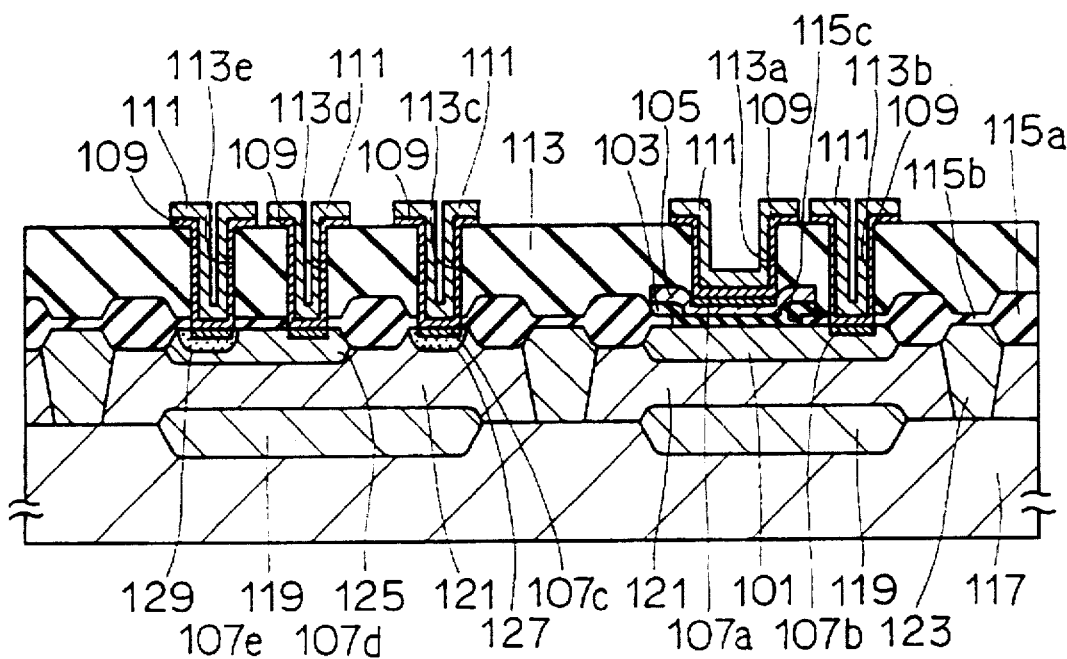

Referring to FIG. 10, aluminum silicon layer 111 is formed entirely on the surface by sputtering. Then, aluminum silicon layer 111 and titanium nitride layer 109 are patterned by photolithography thereby forming interconnection layers 109 and 111 which are in contact with their respective underlying layers via respective contact holes 113a, 113b, 113c, 113d, and 113e.

In the present embodiment, the upper electrode constituting the capacitor consists of non-doped polycrystalline silicon film 105 and silicide layer 107a. Accordingly, the capacitor structure of this embodiment has a breakdown voltage and capacitance which is superior to those of the conventional capacitor structure shown in FIG. 39. Therefore, the capacitor structure of the present embodiment is not likely to operate inaccurately even when the degree of integration is increased.

In this embodiment, the description was given of the example where the lower electrode forming the capacitor is an impurity region 101 formed on the surface of the substrate. However, a lower electrode is not limited to an impurity region but may be formed of doped polycrystalline silicon film. The following description is for an embodiment in which a lower electrode is formed of doped polycrystalline silicon film.

Embodiment 2

Figure 11:
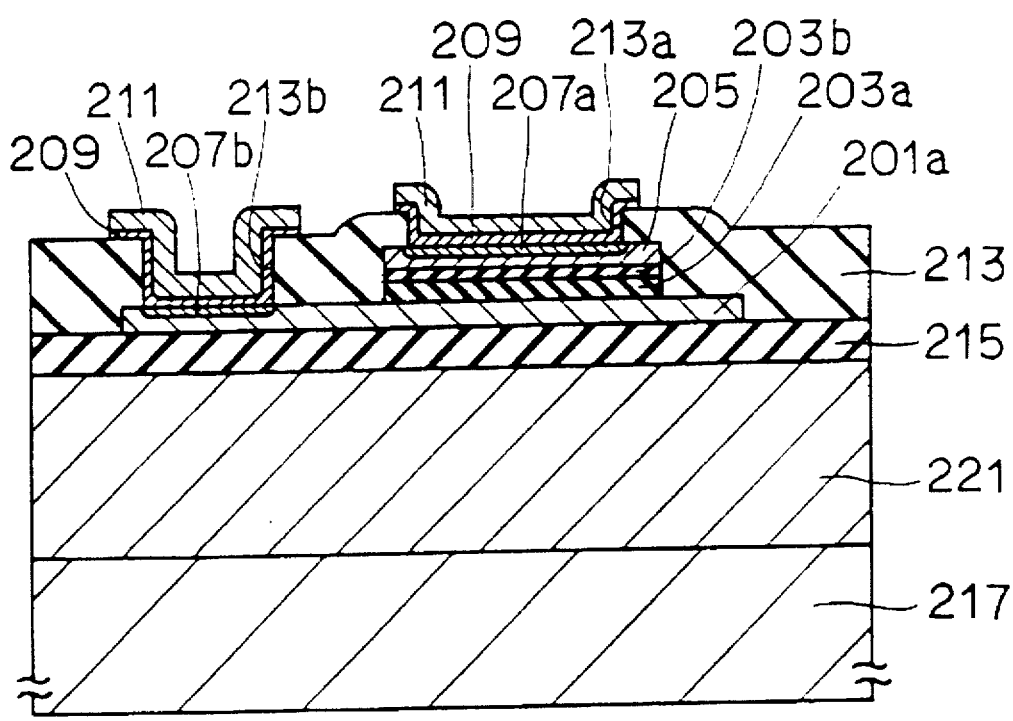
FIG. 11 is a schematic cross sectional view showing a structure of a semiconductor device of a second embodiment in accordance with the present invention.

Referring to FIG. 11, a lower electrode constituting the capacitor of the present embodiment is of a doped polycrystalline silicon film 201a.

More specifically, an epitaxial layer 221 is formed on a surface of a p type silicon substrate 217. On a surface of epitaxial layer 221, an insulating film 215 such as an element isolating oxide film is formed. Doped polycrystalline silicon film 201a which is to be the lower electrode is formed on a surface of insulating film 215 in a patterned condition. A silicon nitride film 203a and a silicon oxide film 203b which are to be a capacitor insulating layer are stacked on a portion of a surface of this non-doped polycrystalline silicon film 201a. An upper electrode 205, 207a is formed on a surface of silicon oxide film 203b.

The upper electrode has a non-doped polycrystalline silicon film 205 and a silicide layer 207a. Non-doped polycrystalline silicon film 205 is formed on a surface of silicon oxide film 203b. Silicide layer 207a is formed at a portion of a surface of non-doped polycrystalline silicon film 205.

On a portion of a surface of doped polycrystalline silicon film 201a which is the lower electrode, a silicide layer 207b is formed.

An interlayer insulating film 213 of silicon oxide film is formed to cover non-doped polycrystalline silicon film 205 and doped polycrystalline silicon film 201a. In interlayer insulating film 213, a contact hole 213a reaching a portion of a surface of the upper electrode and a contact hole 213b reaching a portion of a surface of the lower electrode 201a are formed.

A patterned interconnection layer 209, 211 is formed to be in contact with the underlying silicide layers 207a and 207b via contact holes 213a and 213b, respectively.

The interconnection layer has a barrier layer 209 consisting of, for example, titanium nitride, and an aluminum silicon layer 211. Barrier layer 209 is formed such that it is in contact with silicide layers 207a and 207b through respective contact holes 213a and 213b. Aluminum silicon layer 211 is formed on a surface of this barrier layer 209.

Manufacture of the semiconductor device according to the present invention together with a bipolar transistor will now be described.

Figure 12:
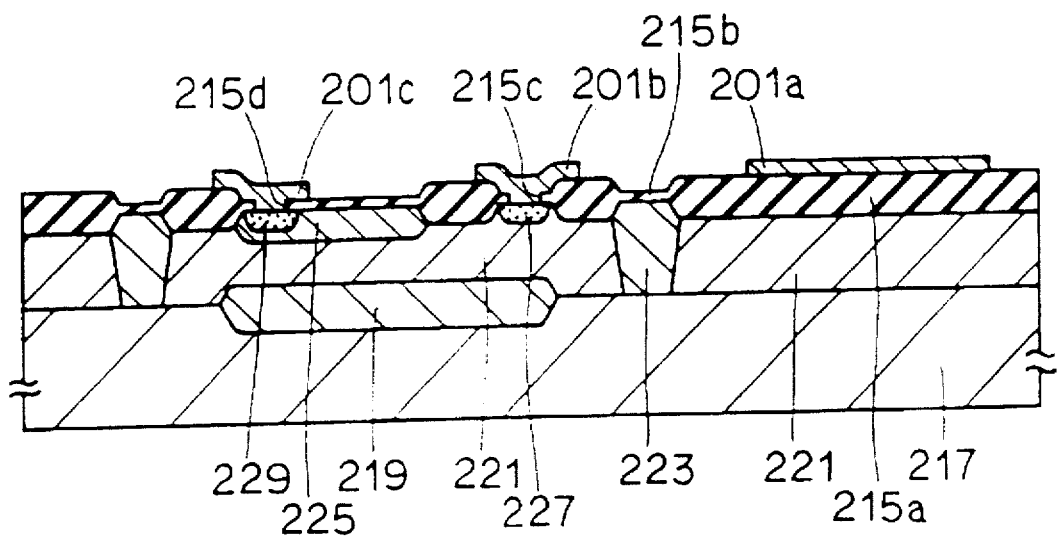
FIGS. 12 to 17 are cross sectional views showing a method of manufacturing the semiconductor device of the second embodiment in accordance with the present invention in order of the steps.

Referring first to FIG. 12, an n type impurity such as antimony (Sb), for example, is implanted to a predetermined surface of p type silicon substrate 217. Heat treatment is then effected thereby forming an $n^+$ diffused region 219 on a portion of a surface of p type silicon substrate 217. Thereafter, an epitaxial layer 221 is formed entirely on the surface of p type silicon substrate 217. As a result, a structure is obtained in which $n^+$ diffused region 219 is buried between p type silicon substrate 217 and epitaxial layer 221.

Then, an element isolating oxide film 215a and a thin silicon oxide film 215b are formed, for example, by LOCOS. A p type impurity is introduced to a predetermined region of epitaxially grown layer thereby forming a $p^+$ diffused region 223 for element isolation.

A p type impurity is implanted to a surface of epitaxial layer 221 located above $n^+$ diffused region, and heat treatment is performed. Thus, a $p^+$ diffused region 225 which is to be a base region of the bipolar transistor is formed.

In thin silicon oxide film 215b located above epitaxial layer 221 and $p^+$ diffused region 225, respective openings 215c and 215d are formed selectively by photolithography, and an n type impurity is implanted thereto. Then, heat treatment at a temperature of 1050° C. is effected in nitride atmosphere for 20 minutes. In this way, $n^+$ diffused regions 227 and 229 which are to be collector and emitter regions of the bipolar transistor are formed at predetermined regions of epitaxial layer 221 and $p^+$ diffused region 225.

A polycrystalline silicon film is formed entirely on the surface by CVD so that it is in contact with $n^+$ diffused regions 227 and 229, respectively, via these respective openings 215c and 215d. To this polycrystalline silicon film, an n type impurity is implanted and then heat treatment is performed to form a doped polycrystalline silicon film. This doped polycrystalline silicon film is patterned by photolithography to form lower electrode 201a of the capacitor, a collector electrode layer 201b, and an emitter layer 201c.

Figure 13:
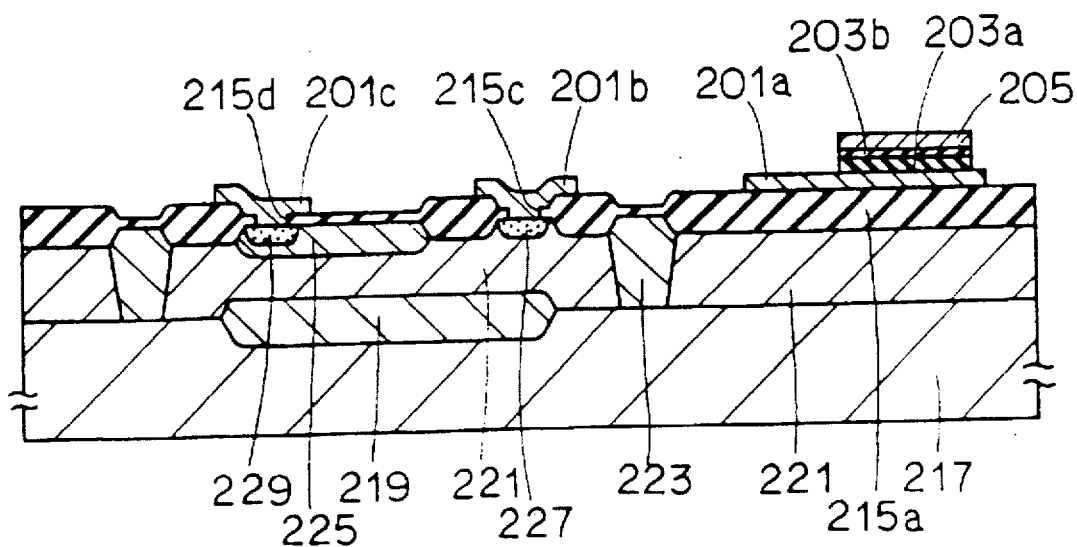

Referring to FIG. 13, silicon nitride film 203a is formed entirely on the surface. Then, wet oxidation is performed thereby forming a silicon oxide film 203b entirely on the surface of silicon nitride film 203a. In addition, a non-doped polycrystalline silicon film 205 is formed entirely on the surface of silicon oxide film 203b by CVD. By photolithography, non-doped polycrystalline silicon film 205, silicon oxide film 203b, and silicon nitride film 203a are patterned successively. As a result, silicon nitride film 203a and silicon oxide film 203b which are to be the capacitor insulating layer are formed only on a portion of a surface of the lower electrode 201a, and non-doped polycrystalline silicon film 205 is formed on that silicon oxide film 203b only.

Figure 14:
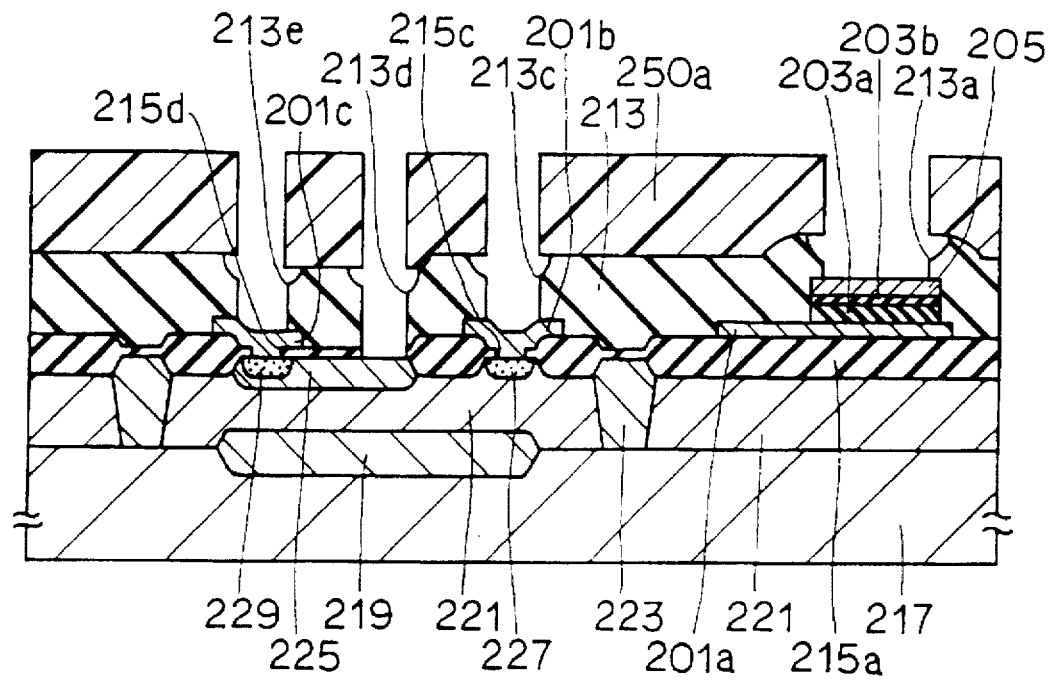

Referring to FIG. 14, interlayer insulating film 213 consisting of silicon oxide film is formed to cover the surface entirely. On the surface of this interlayer insulating film 213, a resist pattern 250a having a desired shape is formed. Using this resist pattern 250a as a mask, interlayer insulating film 213 is subjected to isotropic etching at first. Then, it is etched further anisotropically, still using resist pattern 250a as a mask.

By these isotropic and anisotropic etchings, contact hole 213a exposing a portion of a surface of a non-doped polycrystalline silicon film 205, a contact hole 213c exposing a portion of a surface of collector electrode layer 201b, a contact hole 213d exposing a portion of surface of $p^+$ diffused region 225, and a contact hole 213e exposing a portion of a surface of emitter electrode layer 201c are formed respectively, in interlayer insulating film 213. Resist pattern 250a is then removed.

Figure 15:
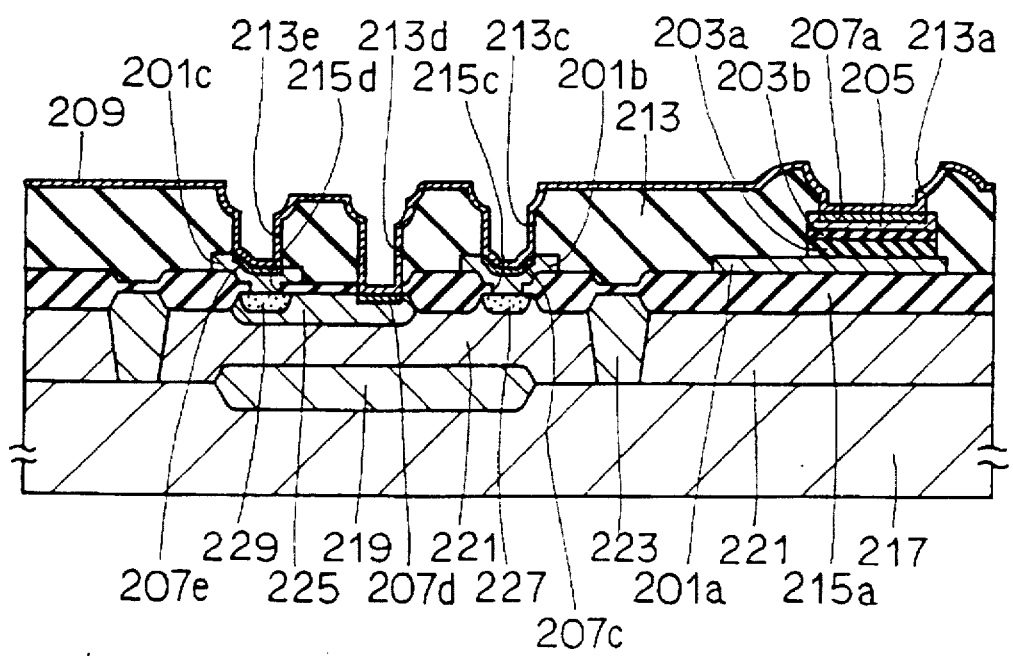

Referring to FIG. 15, titanium layer 209 is formed entirely on the surface by sputtering. Then, annealing is performed with a temperature of 820° C. in nitrogen atmosphere for 30 seconds thereby forming a titanium silicide layer at a portion were titanium layer 209 is in contact with silicon. More specifically, silicide layers 207a, 207c, 207d and 207e consisting of titanium silicide are formed respectively on portions of the surfaces of non-doped polycrystalline silicon film 205, collector electrode layer 201b, p$^+$ diffused region 225, and emitter electrode layer 201c. Portions of the titanium layer where it does not become titanium silicide by annealing would be a titanium nitride layer.

Figure 16:
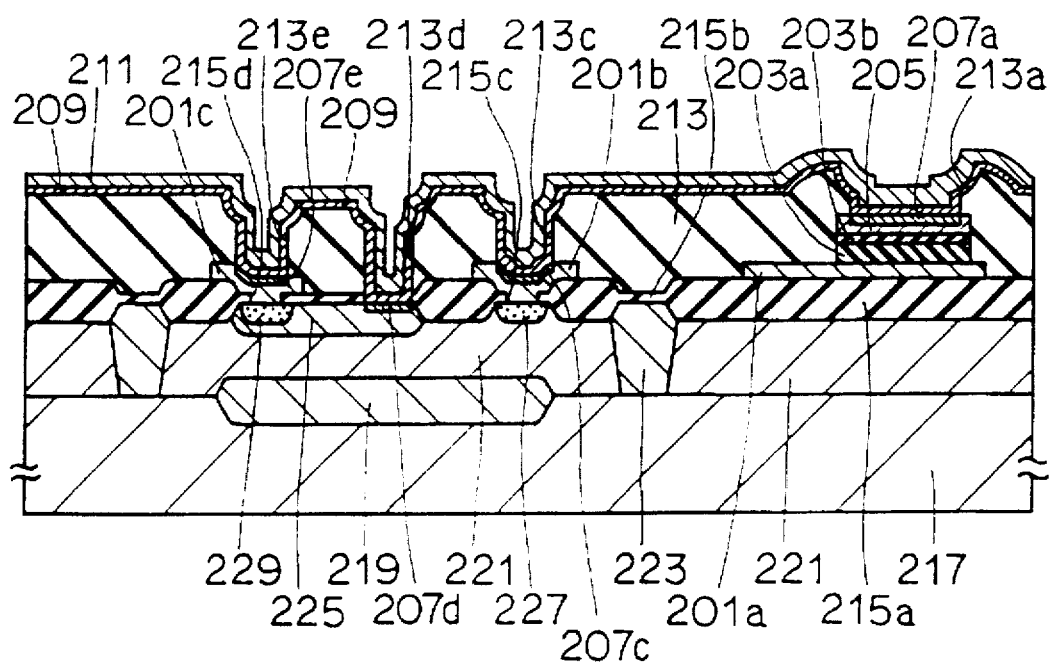

Referring to FIG. 16, an aluminum silicon layer 211 is formed entirely on the surface by sputtering.

Figure 17:
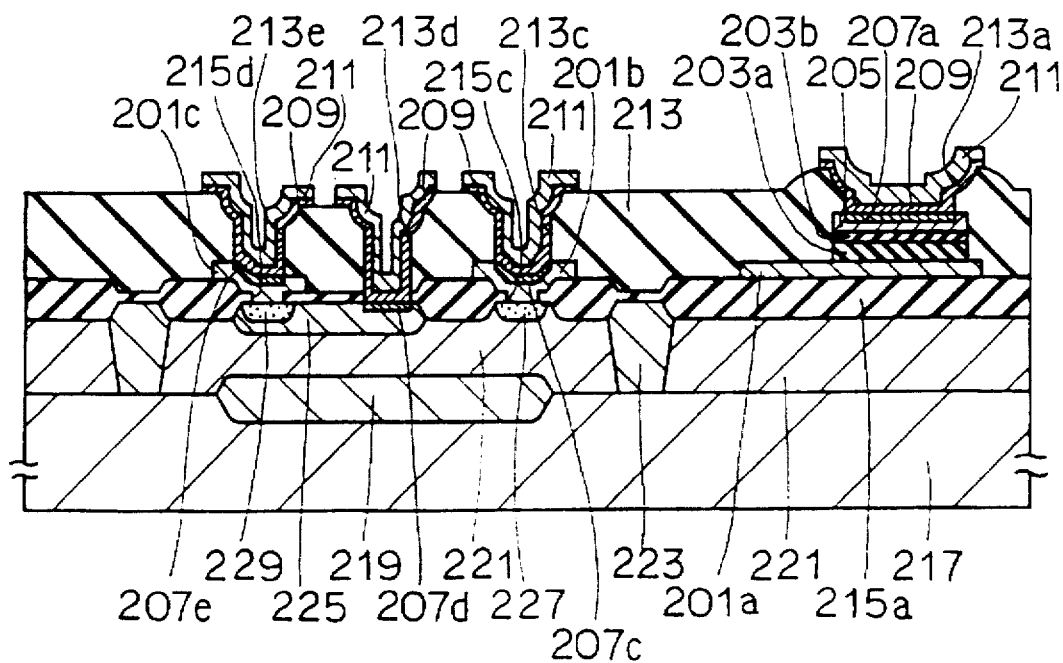

Referring to FIG. 17, titanium nitride layer 209 and aluminum silicon layer 211 are patterned by photolithography thereby forming interconnection layer 209, 211 which is in contact with respective underlying layers through contact holes 213a, 213c, 213d, and 213e.

In the capacitor structure of the present embodiment, the upper electrode constituting the capacitor has non-doped polycrystalline silicon film 205 and silicide layer 207a. Accordingly, breakdown voltage and capacitance obtained in the capacitor structure of the present embodiment is superior to those obtained in the conventional example shown in FIG. 39. Therefore, occurrence of inaccurate operation is not likely in the capacitor structure of the present embodiment even when the device is integrated to a higher degree.

In addition, the lower electrode which constitutes the capacitor is formed of a doped polycrystalline silicon film instead of an impurity region formed on the surface of the substrate in the present embodiment. Accordingly, the capacitor structure of the present embodiment has such advantages as will be described below.

Figure 18:
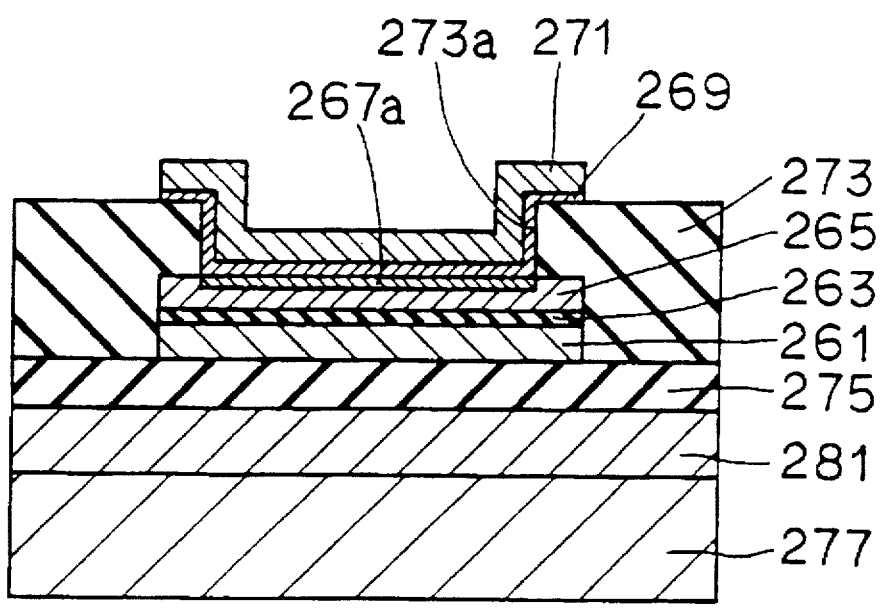
FIG. 18 is a schematic cross sectional view showing a structure of an experiment sample (C).

The inventors of the present invention prepared an experiment sample (C) shown in FIG. 18 in addition to experiment sample (A) of FIG. 1A.

The structure of experiment sample (A) is as already described. Here, p$^+$ diffused region which is to be the lower electrode is formed by implanting boron (B$^+$) with a dose of $1.3 \times 10^{14}$ cm$^{-2}$, and has a diffusion depth of 0.60 µm Referring to FIG. 18, an upper electrode forming the capacitor in experiment sample (C) has a non-doped polycrystalline silicon film and a silicide layer, while a lower electrode is of doped polycrystalline silicon film.

In particular, an epitaxial layer 281 is formed on a surface of a p type silicon substrate 277. On a surface of this epitaxial layer 281, an insulating layer 275 of element isolating oxide film is formed. A patterned doped polycrystalline silicon film 261 which is to be the lower electrode is formed on a surface of this insulating layer 275. This doped polycrystalline silicon film 261 has a thickness of 2500 Å and is formed by implanting phosphorus (P$^+$) to a polycrystalline silicon film with a dose of $4 \times 10^{16}$ cm$^{-2}$. On a surface of this doped polycrystalline silicon film 261, upper electrode 265, 267a is formed, with a silicon nitride film 263 which is to be a capacitor insulating layer therebetween.

The upper electrode has a non-doped polycrystalline silicon film 265 and a silicide layer 267a which is formed on a portion of a surface of non-doped polycrystalline silicon film 265. A silicon oxide film 273 is formed entirely on the surface of insulating layer 275 so as to cover the capacitor. A barrier layer 269 of titanium nitride is formed to be in contact with silicide layer 267a through an opening 273a which is provided in silicon oxide film 273. In addition, an aluminum silicon layer 271 is formed on a surface of barrier layer 269.

Changes in capacitance when a voltage is applied between the capacitor electrodes of experiment samples (A) and (C) with such structures were measured. The results are shown in FIGS. 19 and 20.

Figure 19:
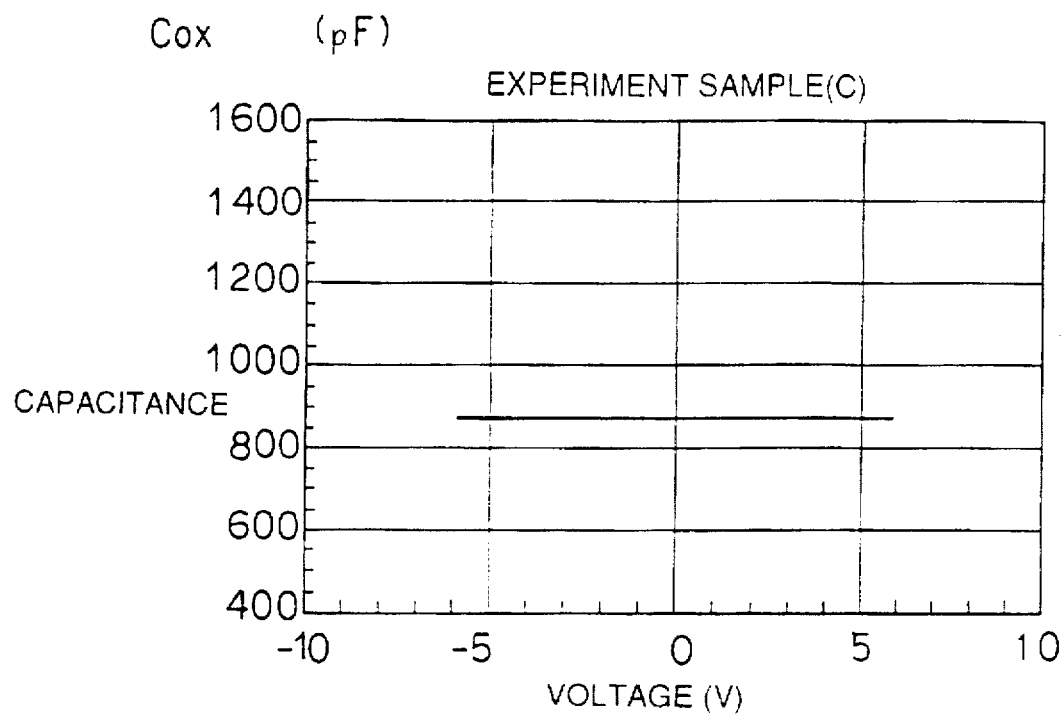
FIG. 19 is a graph showing the voltage applied between the electrodes of experiment sample (C) and its capacitance.
Figure 20:
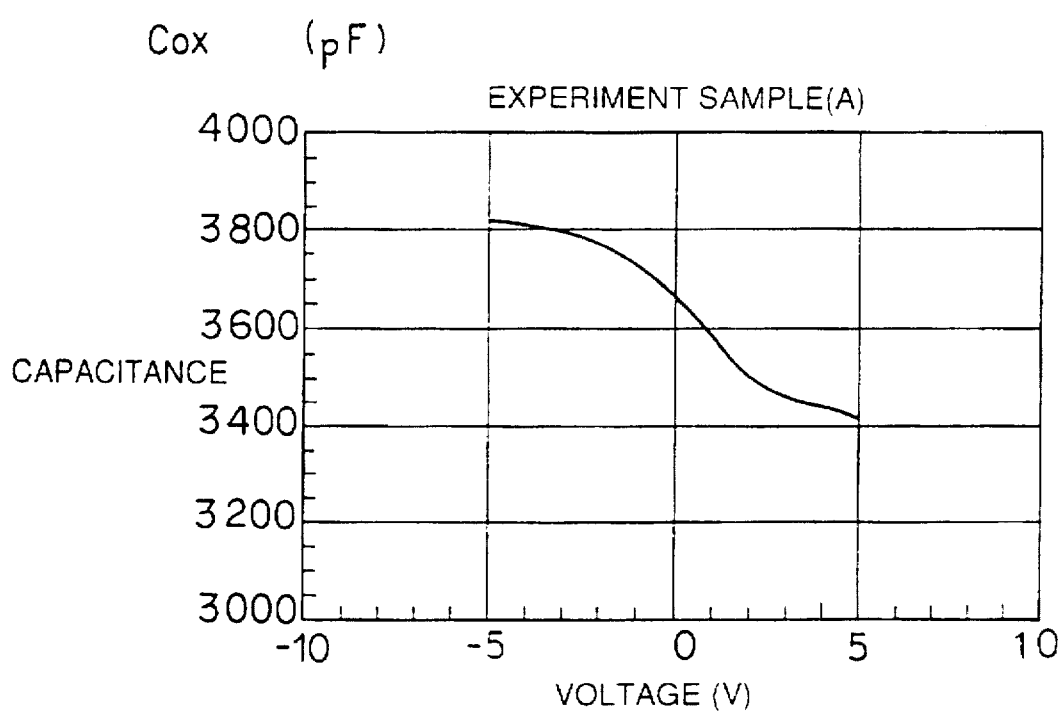
FIG. 20 is a graph showing the voltage applied between the electrodes of experiment sample (A) and its capacitance.

Referring to FIGS. 19 and 20, it can be seen from the measured value that, when the lower electrode forming the capacitor is a doped polycrystalline silicon film, the capacitance is maintained at a constant value even when the voltage applied between the electrodes is made higher. On the contrary, when the lower electrode is an impurity region formed at a surface of a substrate as in experiment sample (A), the capacitance is reduced when the voltage applied between the electrodes is increased. Reduction of capacitance in experiment sample (A) resulting from an increase in the voltage applied between the electrodes will be described in the following.

Referring to FIG. 3, when a relatively high voltage is applied between upper electrode 105, 107a and lower electrode 101, a depletion layer is produced in p$^+$ diffused region 101 forming the lower electrode. This depletion layer is formed at the periphery of capacitor insulating layer 103 (region S). Formation of this depletion layer has an effect which is similar to the effect caused if the capacitor insulating layer is made substantially thicker. Accordingly, high voltage applied between the electrodes would not lead to a larger capacitance of the capacitor.

Formation of this depletion layer in p$^+$ diffused region 101 can be suppressed by increasing the concentration of p$^+$ diffused region 101 which is to be the lower electrode. However, upon manufacturing, this p$^+$ diffused region 101 may be formed in the same process as base region 125 of the bipolar transistor, as shown in FIG. 4. In this event, the concentration of the p$^+$ diffused region cannot be made higher than necessary. Therefore, when the lower electrode is provided as an impurity region, it is difficult to suppress the formation of the depletion layer.

On the contrary, doped polycrystalline silicon film 201a is used as the lower electrode in this embodiment. This doped polycrystalline silicon film 201a is formed in the same process as interconnections and the like such as collector electrode 201b and emitter electrode 201c, as shown in FIG. 12. Since it is preferred that interconnection resistance is as low as possible in an interconnection and the like, impurity can be implanted to the polycrystalline silicon film to a maximum extent. As such, when doped polycrystalline silicon film is used for the lower electrode, limitation by the manufacturing process to the increase of the impurity concentration in the polycrystalline silicon is lower. Accordingly, it is easier to increase the impurity concentration in polycrystalline silicon film 201a which is the lower electrode in the present embodiment. Thus, use of the doped polycrystalline silicon film for the lower electrode readily suppresses formation of a depletion layer in the lower electrode.

Based on the foregoing, in the capacitor structure of the present invention, capacitance value is kept constant even when the voltage applied between the electrodes constituting the capacitor is relatively high.

Specific dielectric constant of a silicon nitride film is higher than that of silicon oxide film. Accordingly, when silicon nitride film is used as a capacitor insulating layer, a larger capacitance is obtained, compared to a capacitor insulating layer of silicon oxide film. Meanwhile, generation of leak current is less likely in silicon oxide film than in silicon nitride film. Accordingly, when silicon oxide film is used as a capacitor insulating layer a higher capacitor breakdown voltage can be obtained, compared to a capacitor insulating layer of silicon nitride film.

In the present embodiment, a double-layered structure of silicon nitride film 203a and silicon oxide film 203b is used as the capacitor insulating layer so that an increased capacitance owing to silicon nitride film 203a and an increased capacitor breakdown voltage owing to silicon oxide film 203b are both obtained.

Although a double-layered structure of silicon nitride film 203a and silicon oxide film 203b has been defined as the capacitor insulating layer in the description of the present embodiment, the capacitor insulating layer is not limited to the above structure. A structure described in embodiment 3 may also be acceptable.

Embodiment 3

Figure 21:
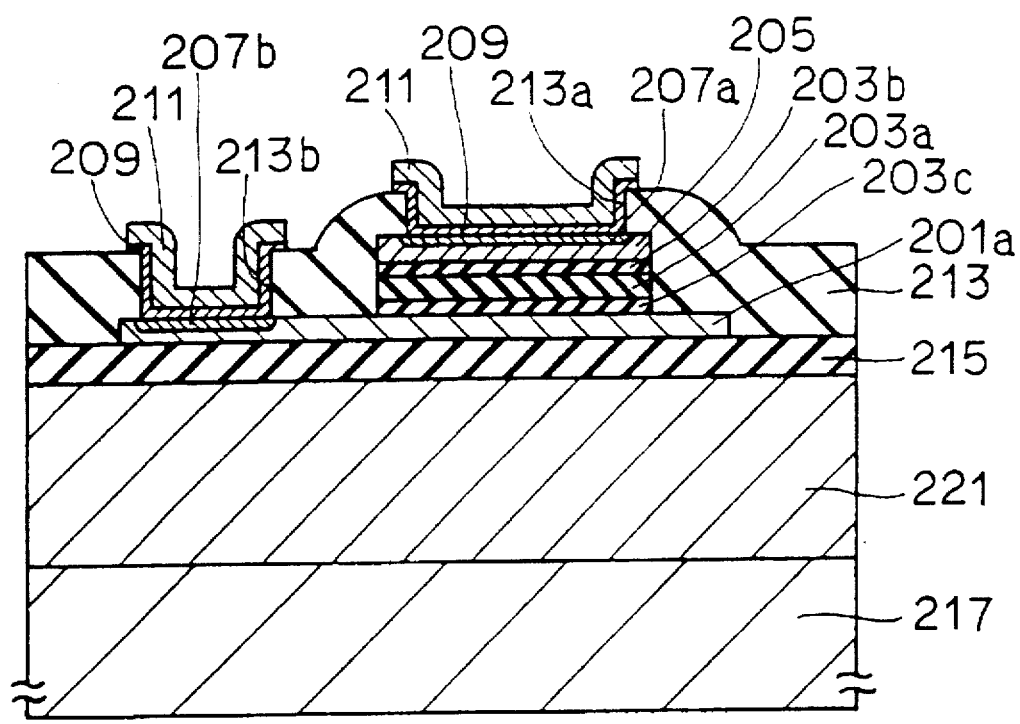
FIG. 21 is a schematic cross sectional view showing a structure of a semiconductor device of a third embodiment in accordance with the present invention.

Referring to FIG. 21, the present embodiment is different from the second embodiment in the structure of a capacitor insulating layer.

In this embodiment, the capacitor insulating layer has a stacked structure of three layers including a silicon oxide film 203c, a silicon nitride film 203a, and a silicon oxide film 203b. More specifically, the capacitor insulating layer is formed by stacking silicon oxide film 203c, silicon nitride film 203a, and silicon oxide film 203b in this order on a surface of a doped polycrystalline silicon film 201a which is a lower electrode.

Since the structure other than what was described above is mostly similar to that of the second embodiment of the present invention, further description is not given.

Manufacture of a semiconductor device according to the present embodiment in combination with a bipolar transistor will now be described.

First, a method of manufacturing the present embodiment is performed as in the second embodiment shown in FIG. 12.

Figure 22:
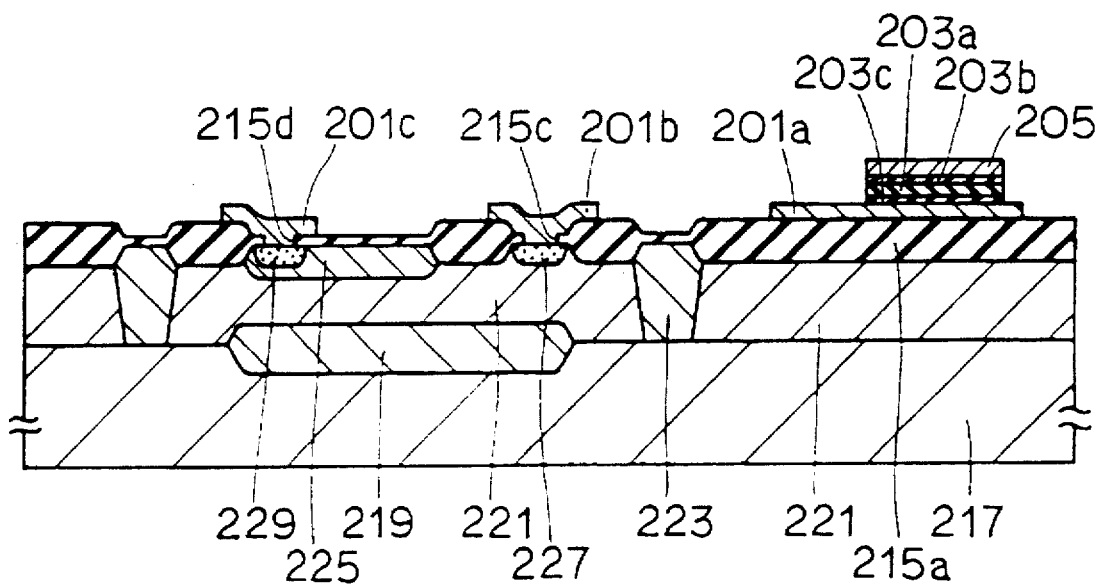
FIGS. 22 and 23 are schematic cross sectional views showing a method of manufacturing a semiconductor device of the third embodiment in accordance with the present invention in order of the steps.

Referring next to FIG. 22, silicon oxide film 203c is formed entirely on the surface, silicon nitride film 203a is then formed by CVD, and silicon oxide film 203b is formed entirely on the surface of silicon nitride film 203a by wet oxidation. On the entire surface of this silicon oxide film 203b, a non-doped polycrystalline silicon film 205 is formed by CVD. Non-doped polycrystalline silicon film 205, silicon oxide film 203b, silicon nitride film 203a, and silicon oxide film 203c formed in this way are patterned to obtain a desired shape by photolithography so that they are left only on a surface of lower electrode 201a.

Figure 23:
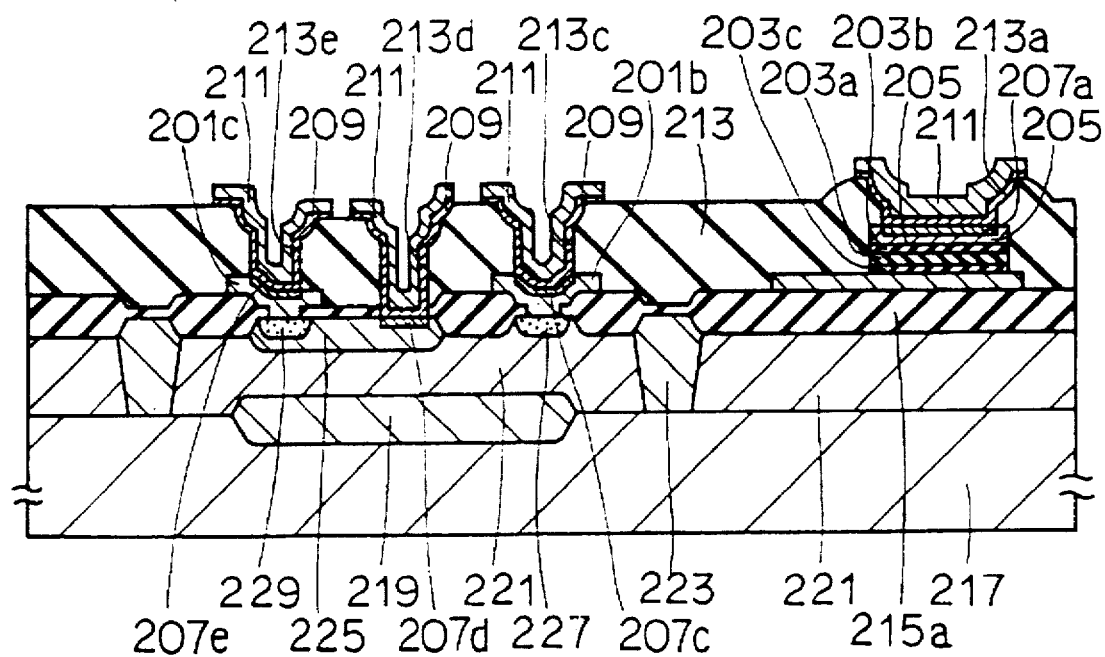

Thereafter, a process similar to that of the second embodiment is carried out to obtain a structure shown in FIG. 23.

In this embodiment, an upper electrode forming the capacitor has non-doped polycrystalline silicon film 205 and a silicide layer 207a. Accordingly, the capacitor structure of the present embodiment has better capacitance and breakdown voltage as compared to the conventional capacitor structure shown in FIG. 39. As a result, the capacitor structure of the present embodiment would not operate inaccurately even when the degree of integration is made higher.

In addition, since the lower electrode forming the capacitor in this embodiment consists of doped polycrystalline film 201a, the capacitance is kept constant even when the voltage applied between the capacitor electrodes is made relatively high, as in the second embodiment. Accordingly, a stable operation can be assured.

Furthermore, in the present embodiment, silicon oxide film 203c is added to the structure of the capacitor insulating layer described in the second embodiment. This silicon oxide film 203c is located between lower electrode 201a and silicon nitride film 203a. As a result, generation of leak current in the vicinity of upper electrode 205, 207a of the capacitor can be prevented by silicon oxide film 203b while generation of leak current in the vicinity of lower electrode 201a can be prevented by silicon oxide film 203c. Therefore, a capacitor with an even better breakdown voltage can be obtained.

Although description was given of for an example of a lower electrode of the capacitor which is constituted of a single layer of doped polycrystalline silicon film in the second and third embodiments, the lower electrode may have a structure in which a plurality of layers are stacked together. The following is a description of an embodiment in which a lower electrode is made of a stack of multiple layers.

Embodiment 4

Figure 24:
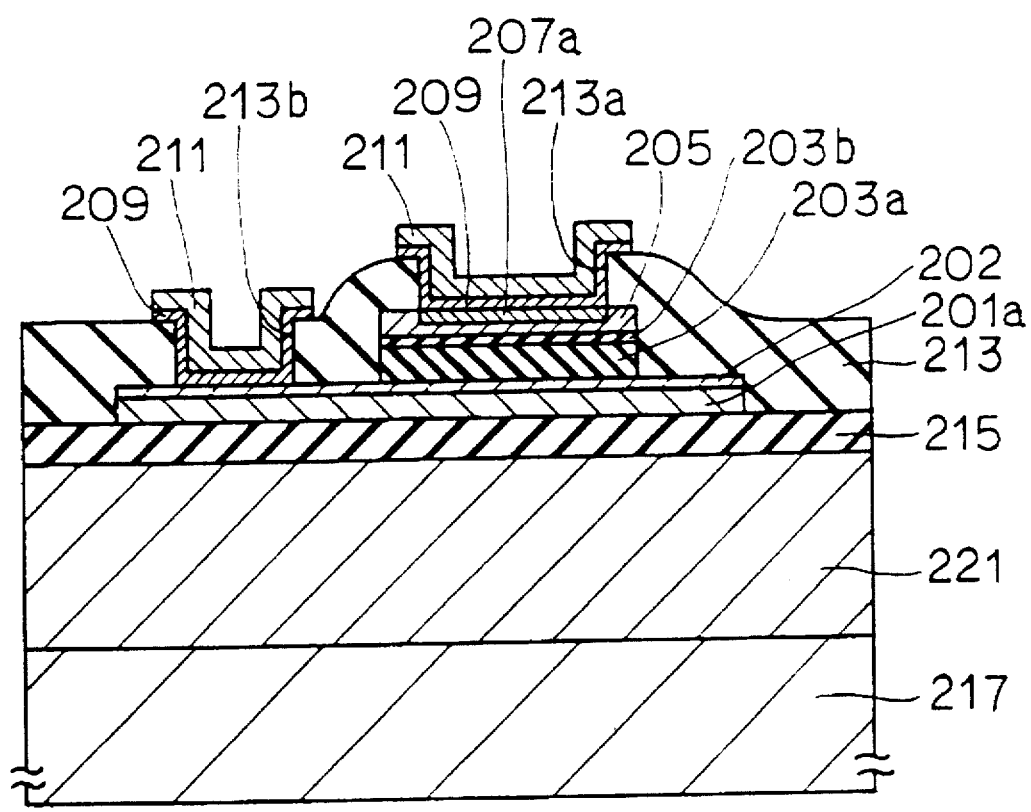
FIG. 24 is a schematic cross sectional view showing a structure of a semiconductor device of a fourth embodiment in accordance with the present invention.

Referring to FIG. 24, the present embodiment is different from the second embodiment in the structure of the lower electrode.

In this embodiment, the lower electrode has a doped polycrystalline silicon film 201a and a silicide layer 202. Doped polycrystalline silicon film 201a is formed on a surface of an insulating layer 215 by patterning. Silicide layer 202 is formed entirely on the surface of this doped polycrystalline silicon film 201a.

Since the structure of the other portions is mostly similar to the second embodiment, further description is not given.

Manufacture of the semiconductor device according to the present embodiment in combination with a bipolar transistor will be described next.

First, a method of manufacturing the present embodiment is performed as in the second embodiment shown in FIG. 12.

Figure 25:
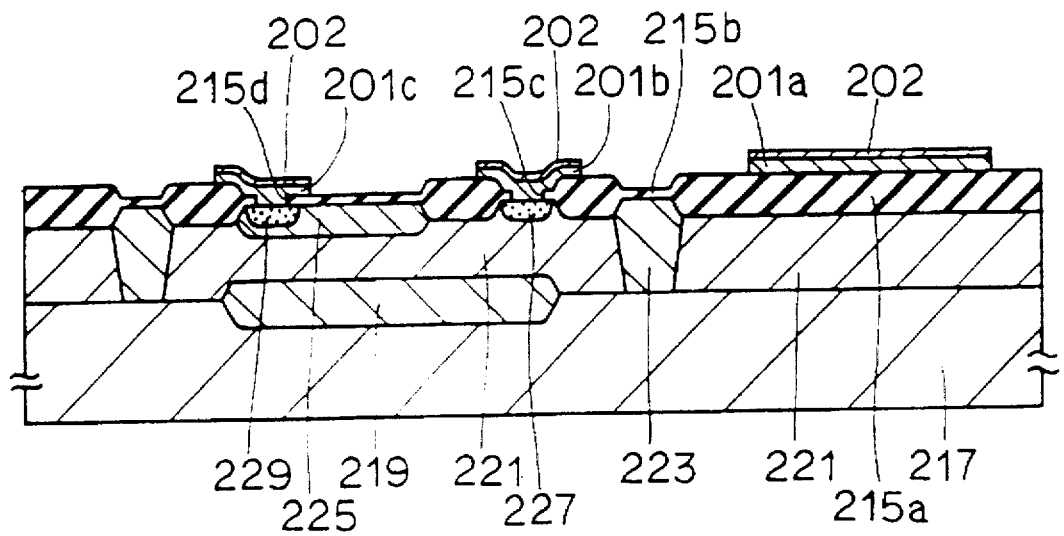
FIGS. 25 to 30 are schematic cross sectional views showing a method of manufacturing the semiconductor device of the fourth embodiment in accordance with the present invention in order of the steps.

Referring to FIG. 25, the difference from the second embodiment resides in that a lower electrode, a collector electrode layer, and an emitter electrode layer are formed by the following steps. First, a polycrystalline silicon film is formed entirely on the surface. This polycrystalline silicon film is subjected to implantation of an n type impurity followed by heat treatment, to form a doped polycrystalline silicon film. Then, the substrate is heated to a temperature of 25° C. to 400° C. in argon (Ar) atmosphere under pressure of 2 to 10 mTorr., thereby forming tungsten silicide layer 202 entirely on the surface of the doped polycrystalline silicon film by sputtering. These doped polycrystalline silicon film and tungsten silicide layer 202 are patterned by photolithography to form respectively the lower electrode 201a, 202; a collector electrode layer 201b, 202; and emitter electrode layer 201c, 202.

Figure 26:
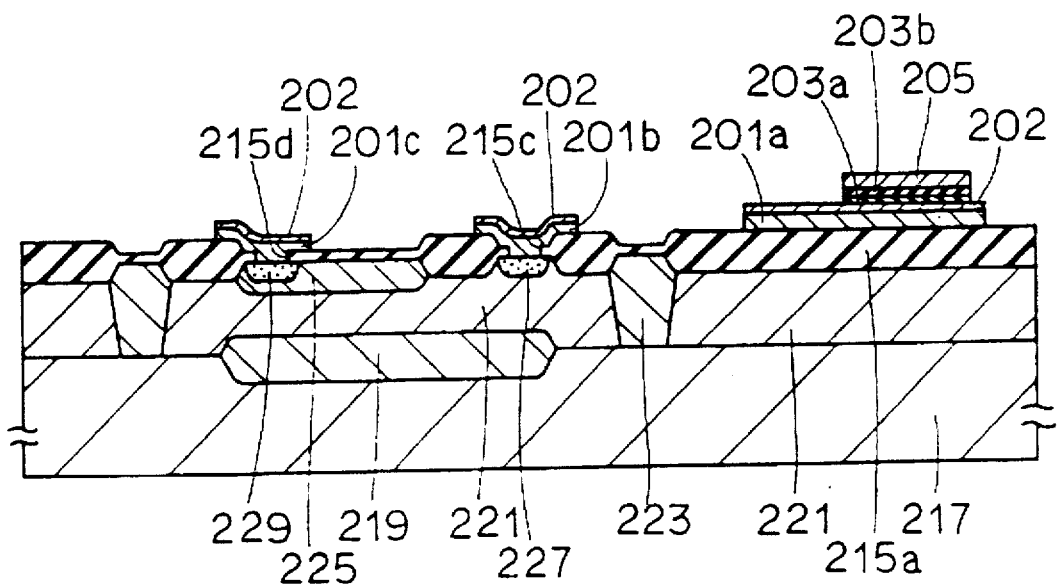

Referring to FIG. 26, a silicon oxide film 203b is formed entirely on the surface by CVD. Then, wet oxidation is performed, thereby forming a silicon oxide film 203b entirely on the surface of silicon nitride film 203a. A non-doped polycrystalline silicon film 205 is formed entirely on the surface of silicon oxide film 203b. These non-doped polycrystalline silicon film 205, silicon oxide film 203b, and silicon nitride film 203a are patterned successively by photolithography such that they are left on lower electrode 201a, 202.

Figure 27:
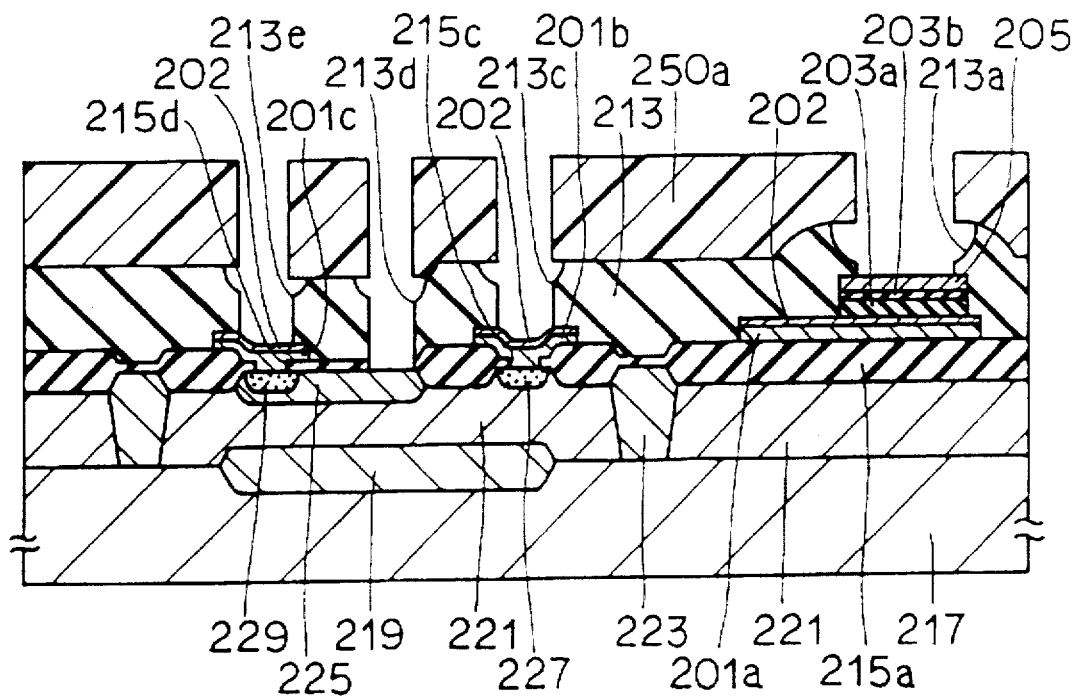

Referring to FIG. 27, an interlayer insulating film 213 of BPSG (boron-doped phospho-silicate glass) film, for example, is formed to cover the surface entirely. The upper surface of this interlayer insulating film 213 is subjected to planarization. On this upper surface of interlayer insulating film 213, a resist pattern 250a having a desired shape is formed. Using this resist pattern 250a as a mask, interlayer insulating film 213 is etched isotopically first. Then, it is etched anisotropically, still using resist pattern 250a as a mask.

These isotropic and anisotropic etchings form a contact hole 213a reaching a surface of non-doped polycrystalline silicon film 205, a contact hole 213c reaching a portion of a surface of collector electrode 201b, 202, a contact hole 213d reaching a p$^+$ diffused region 225, and contact hole 213e reaching emitter electrode layer 201c, 202, respectively. Resist pattern 250a is then removed.

Figure 28:
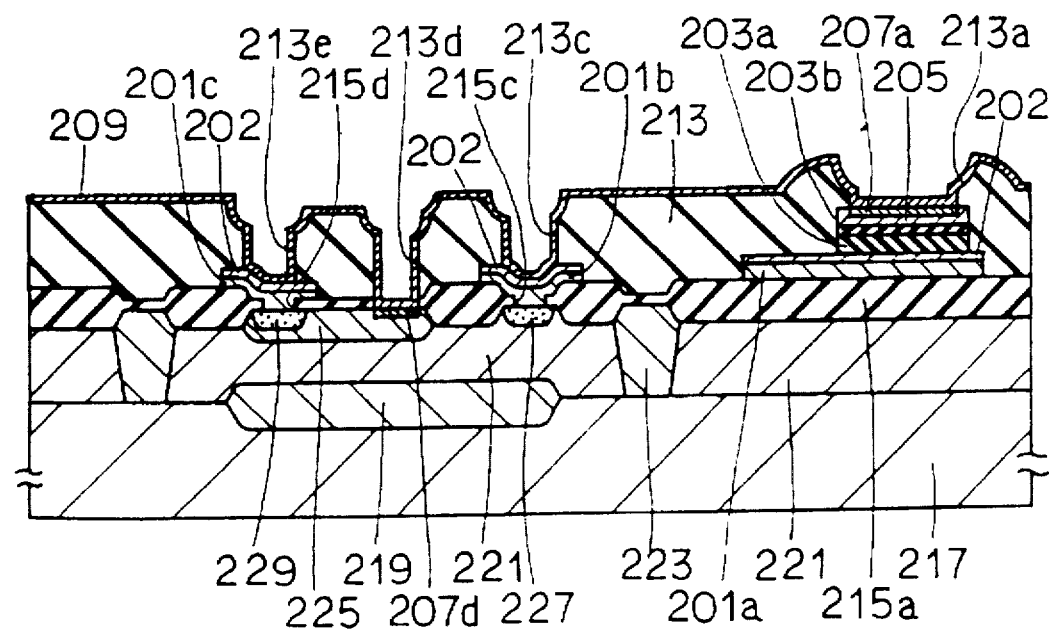

Referring to FIG. 28, a titanium layer 209 is formed entirely on the surface by sputtering. Then, annealing is performed in a nitrogen atmosphere at a temperature of 820° C. for 30 seconds. Thus, titanium silicide layer is formed at the portion where titanium layer 209 is in contact with silicon. More specifically, a silicide layer 207a is formed at a portion where titanium layer 209 is in contact with non-doped polycrystalline silicon film 205, and silicide layer 207d is formed at a portion where it is in contact with p$^+$ diffused region 225, respectively. In addition, the portions of the titanium layer which do not become titanium silicide layer forms titanium nitride layer 209.

Figure 29:
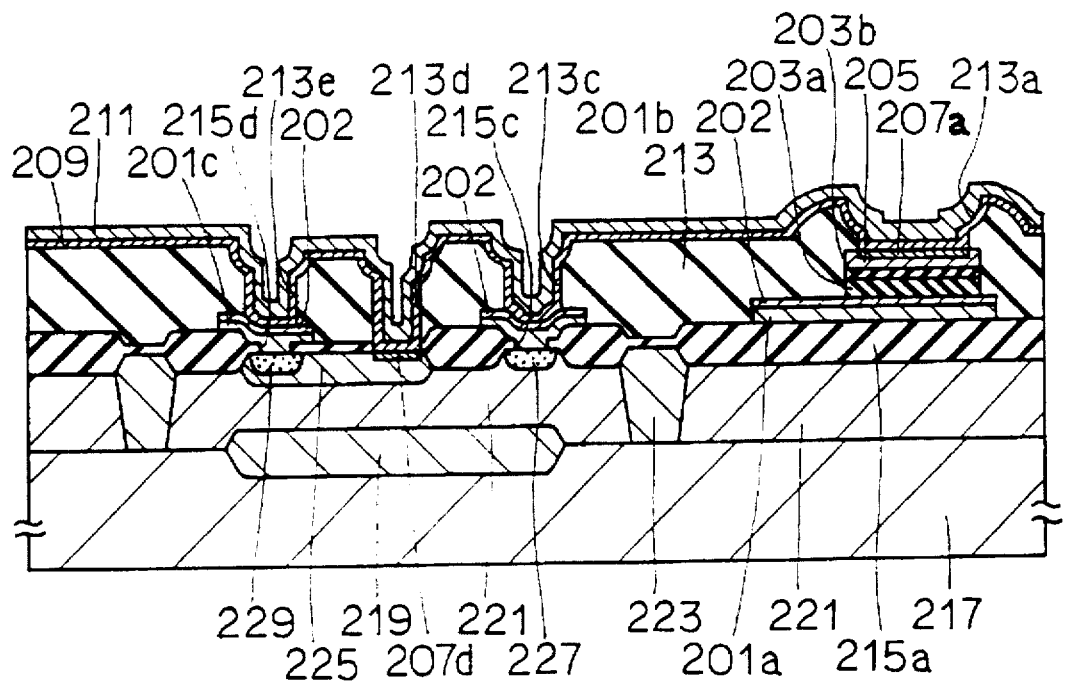

Referring to FIG. 29, an aluminum silicon layer 211 is formed entirely on the surface by sputtering.

Figure 30:
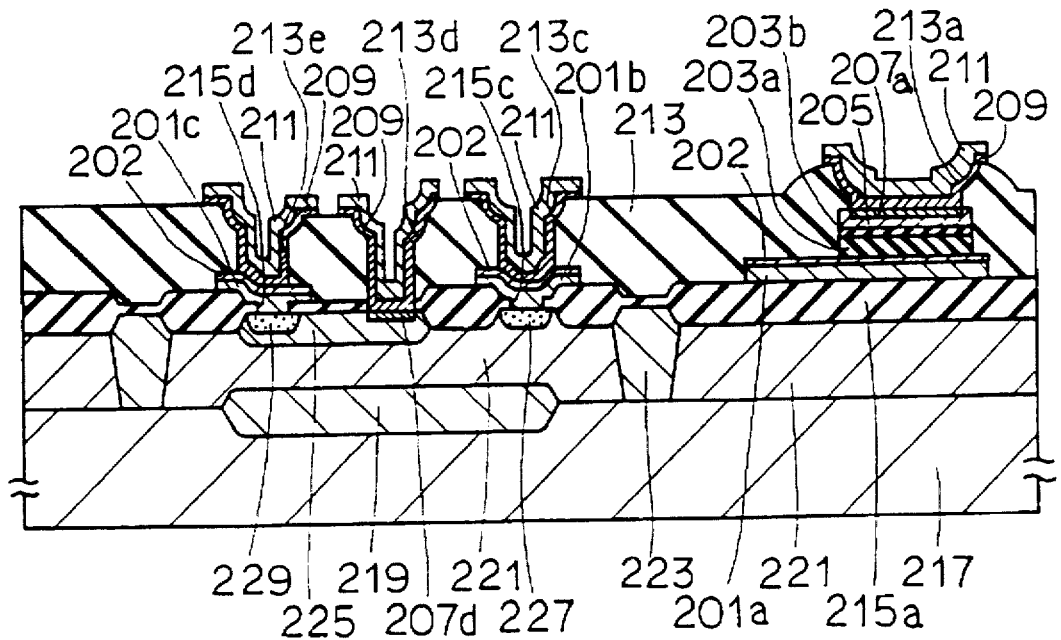

Referring to FIG. 30, aluminum silicon layer 211 and titanium nitride layer 209 are patterned successively by photolithography to form interconnection layers 209 and 211 which are in contact with their respective underlying layers through contact holes 213a, 213c, 213d, and 213e.

In the present embodiment, the upper electrode forming the capacitor has non-doped polycrystalline silicon film 205 and a silicide layer 207a. Accordingly, capacitance and breakdown voltage of the capacitor structure according to the present embodiment are better than those of the conventional capacitor structure shown in FIG. 39. Therefore, the capacitor structure of the present embodiment is not likely to operate inaccurately even when it is integrated to a higher degree.

Moreover, the lower electrode forming the capacitor in this embodiment includes a stacked structure of doped polycrystalline silicon film 201a and silicide layer 202, instead of an impurity region formed on the surface of a substrate. Accordingly, the capacitance is maintained constant even when a relatively high voltage is applied between the electrodes forming the capacitor. Therefore, it is possible to implement a stable operation with the capacitor structure of the present embodiment.

In addition, since the capacitor insulating layer is formed of a stacked structure of two layers including silicon nitride film 203a and silicon oxide film 203b, a capacitor having higher capacitance and breakdown voltage as in the second embodiment can be obtained also in the present embodiment.

Furthermore, the lower electrode has a stacked structure of doped polycrystalline silicon film 201a and silicide layer 202. Accordingly, sheet resistance value for the entire lower electrode can be set lower than in the example of the lower electrode consisting of a single layer of doped polycrystalline silicon film. Therefore, a capacitor which further contributes to an increase in the capacitance of the capacitor can be obtained in the present embodiment.

Although description was given of the example in which capacitor insulating layer is formed of a stacked structure of two layers including silicon nitride film 203a and silicon oxide film 203b in the present embodiment, it is not limited to the above structure. The capacitor insulating layer may be formed by stacking three or more layers. The following is a description of an embodiment in which the capacitor insulating layer is of a structure formed by stacking three or more layers.

Embodiment 5

Figure 31:
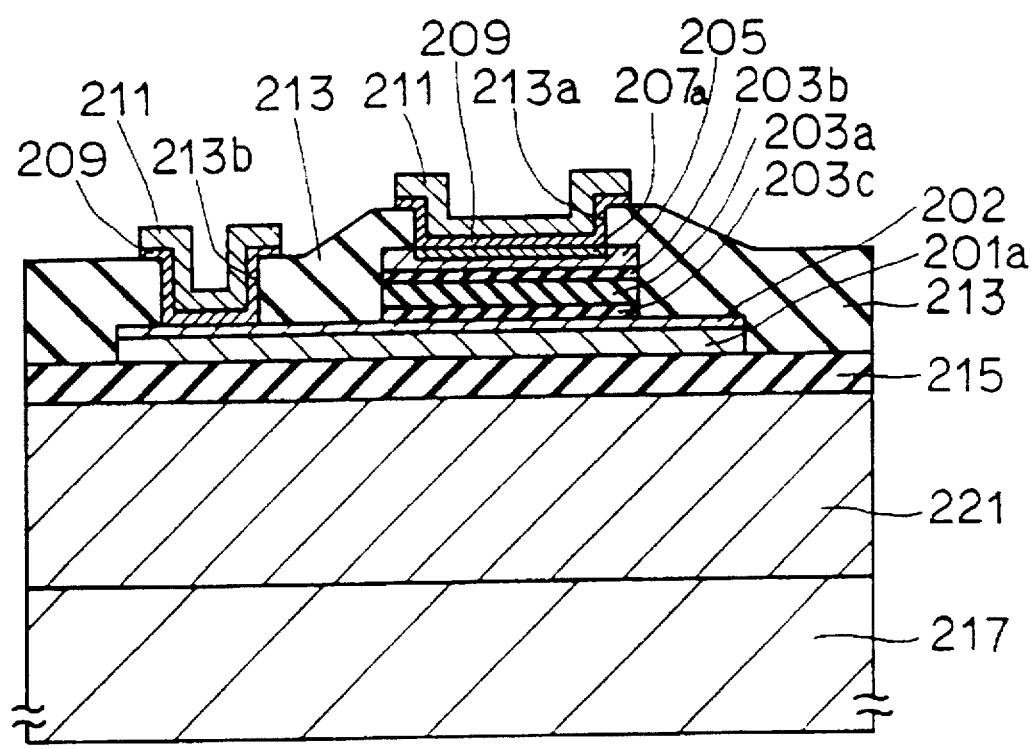
FIG. 31 is a schematic cross sectional view showing a structure of a fifth embodiment in accordance with the present invention.

Referring to FIG. 31, a semiconductor device of the present embodiment is different from that of the fourth embodiment in the structure of the capacitor insulating layer. The capacitor insulating layer of the present embodiment has a structure in which a silicon oxide film 203c, a silicon nitride film 203a, and silicon oxide film 203b are stacked successively on a surface of a silicide layer 202.

Since the structure of other portions is mostly similar to the structure of the fourth embodiment, further description is not given.

Manufacture of the semiconductor device according to the present embodiment in combination with a bipolar transistor will be described next.

First, a manufacturing method according to the present embodiment is carried out by a process similar to that of the fourth embodiment in FIG. 25.

Figure 32:
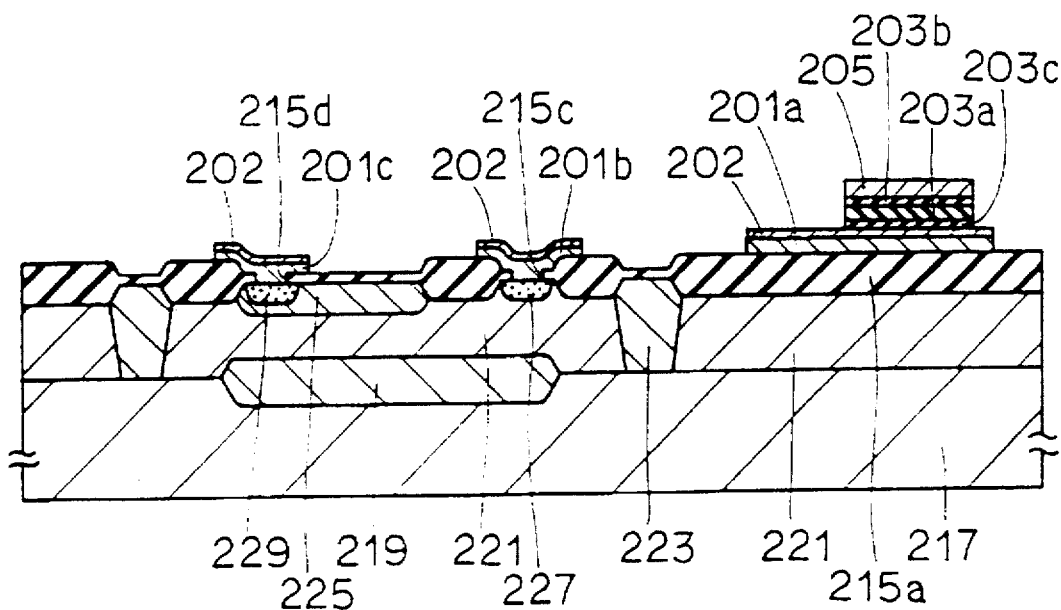
FIGS. 32 and 33 are schematic cross sectional views showing a method of manufacturing the semiconductor device of the fifth embodiment in accordance with the present invention in order of the steps.

Referring next to FIG. 32, silicon oxide film 203c is formed entirely on the surface, silicon nitride film 203a is formed by CVD, and then wet oxidation is performed so as to form silicon oxide film 203b entirely on the surface of silicon nitride film 203a. A non-doped polycrystalline silicon film 205 is formed entirely on the surface of this silicon oxide film 203b by CVD. This non-doped polycrystalline silicon film 205 together with silicon oxide film 203b, silicon nitride film 203a, and silicon oxide film 203c are patterned successively by photolithography so that they are left only on a lower electrode 201a, 202.

Figure 33:
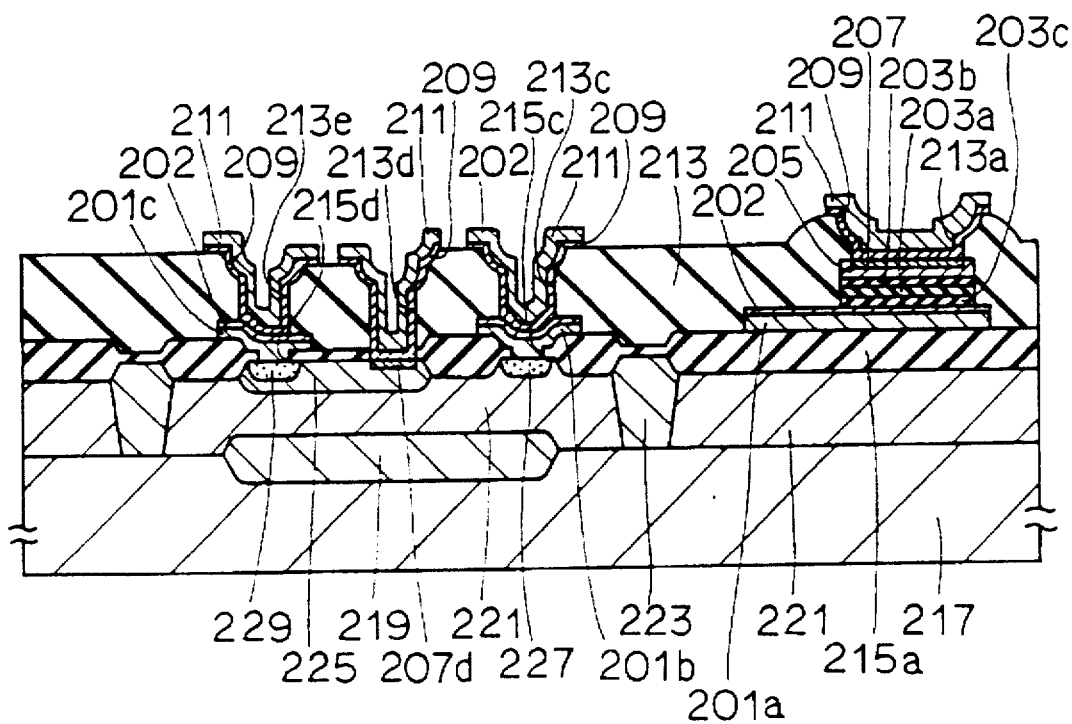

Thereafter, a structure shown in FIG. 33 is obtained by a process which is mostly similar to that of the fourth embodiment.

In the present embodiment, an upper electrode forming the capacitor has a non-doped polycrystalline silicon film 205 and a silicide layer 207. Thus, capacitance and breakdown voltage of the capacitor structure according to the present embodiment is superior to those of the conventional capacitor shown in FIG. 39. Accordingly, the capacitor structure of the present embodiment is not likely to operate inaccurately even when the degree of integration is increased.

Furthermore, in the present embodiment, the lower electrode forming the capacitor has a stacked structure of doped polycrystalline silicon film 201a and a silicide layer 202, instead of an impurity region formed on a surface of a substrate. Therefore, the capacitance is maintained at a constant value even when the voltage applied between the electrodes forming the capacitor is relatively high. Accordingly, the capacitor structure of the present embodiment is capable of stable operation even in a device in which a relatively high voltage is employed.

In addition, since the capacitor insulating layer has a stacked structure of three layers including silicon oxide film 203c, silicon nitride film 203a and silicon oxide film 203b, a capacitor which has an even better breakdown voltage as in the third embodiment described previously can be obtained in this embodiment also.

In addition, since the lower electrode has a stacked structure of two layers including doped polycrystalline silicon film 20a and silicide layer 202 in this embodiment, a capacitor which can contribute even more to an increase of the capacitance of the capacitor as in the fourth embodiment can also be obtained.

Embodiment 6

Figure 34:
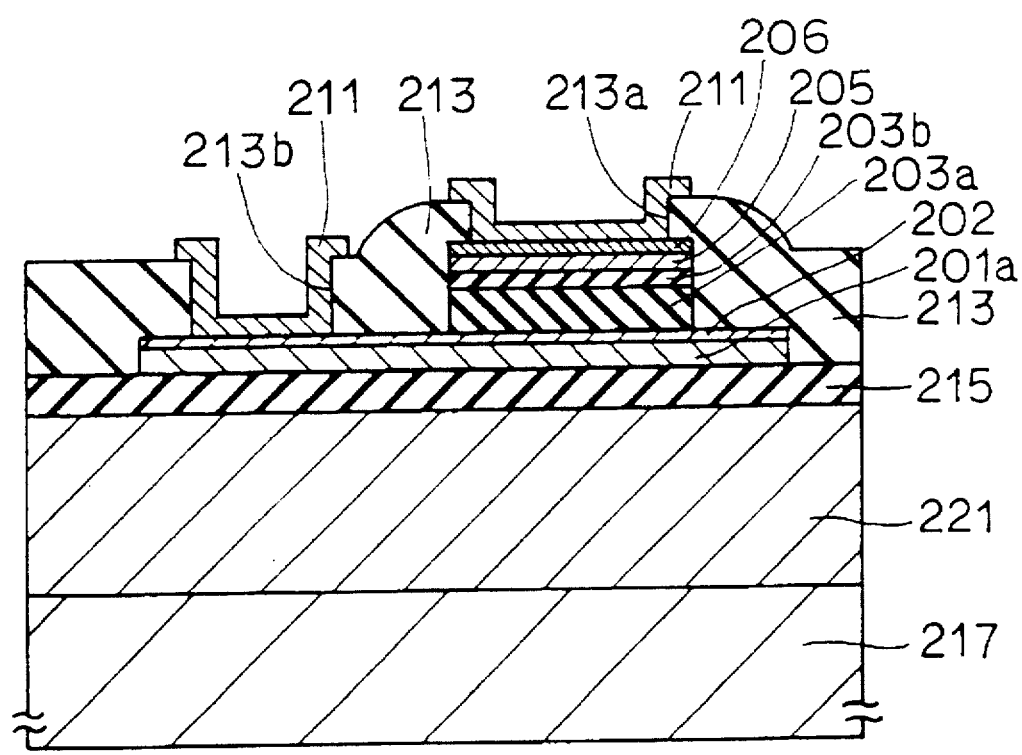
FIG. 34 is a schematic cross sectional view showing a structure of a semiconductor device of a sixth embodiment in accordance with the present invention.

Referring to FIG. 34, the structure of the present embodiment is different from that of the fourth embodiment in the structure of an upper electrode and an interconnection layer. The upper electrode of the present embodiment has a non-doped polycrystalline silicon film 205 and a silicide layer 206. Non-doped polycrystalline silicon film 205 is formed on a surface of capacitor insulating layer 203a, 203b. Silicide layer 206 is formed entirely on the surface of this non-doped polycrystalline silicon film 205.

The interconnection layer of the present embodiment is of a single layer of aluminum silicon layer 211.

Since the structure of other portions is mostly similar to that of the fourth embodiment, further description is not given.

Manufacture of the semiconductor device according to the present embodiment together with a bipolar transistor will now be described.

A manufacturing method according to the present embodiment is carried out by a process similar to that of the fourth embodiment shown in FIG. 25.

Figure 35:
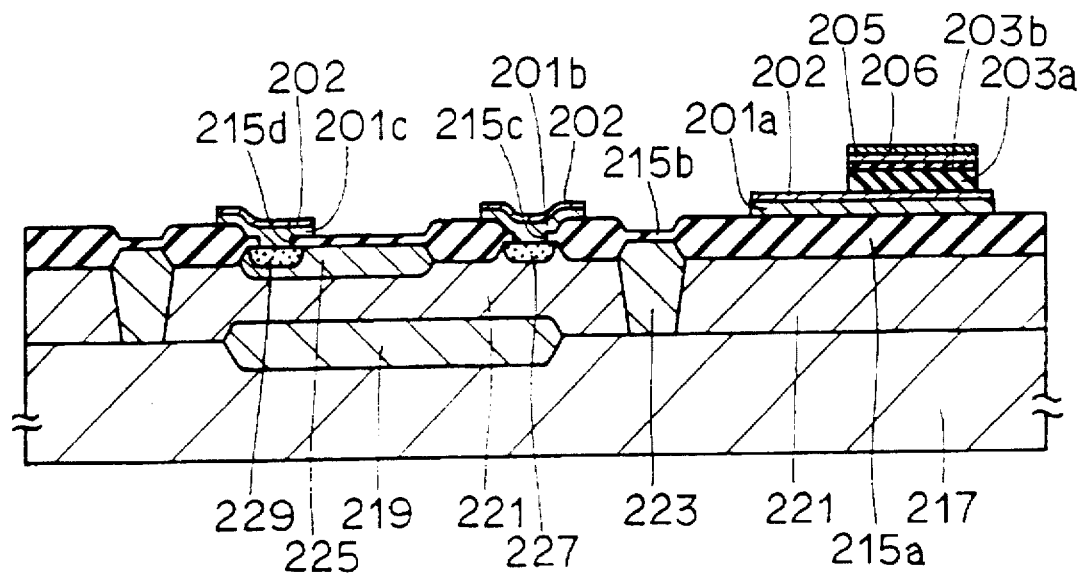
FIG. 35 to 38 are schematic cross sectional views showing a method of manufacturing the semiconductor device of the sixth embodiment in accordance with the present invention in order of the steps.
Figure 36:
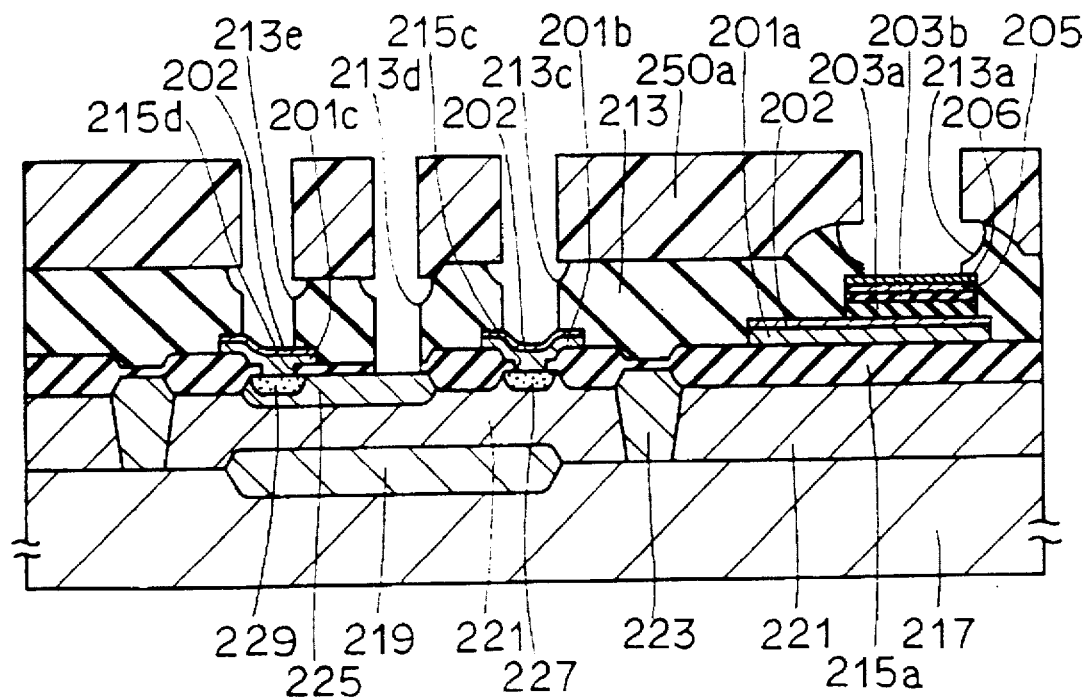

Referring next to FIG. 35, a silicon nitride film is formed entirely on the surface by CVD, and then wet oxidation is performed so as to form a silicon oxide film 203b entirely on the surface of a silicon nitride film 203a. Non-doped polycrystalline silicon film 205 is formed entirely on the surface of this silicon oxide film 203b by CVD. Tungsten silicide layer 206 is formed entirely on the surface of non-doped polycrystalline silicon film 205 with the substrate heated at a temperature of 25° C.–400° C. in an argon atmosphere under pressure of 2 to 10 mTorr. by sputtering. Thereafter, tungsten silicide layer 206, non-doped polycrystalline silicon film 205, silicon oxide film 203b, and silicon nitride film 203a are patterned successively so that they are left only on a lower electrode 201a, 202.

Then, an interlayer insulating film 213 of BPSG is formed to cover the surface entirely. Planarization is performed on the upper surface of this interlayer insulating film 213. On the upper surface of the interlayer insulating film, a resist pattern 250a with a desired shape is formed. Using this resist pattern 250a as a mask, interlayer insulating film 213 is etched isotopically first. Then it is subjected to anisotropic etching, still using resist pattern 250a as a mask. These isotropic and anisotropic etchings form a contact hole 213a reaching a portion of a surface of tungsten silicide layer 206, a contact hole 213c reaching a portion of a surface of a collector electrode layer 201b, 202, a contact hole 213d reaching a portion of a surface of a p$^+$ diffused region 225, and a contact hole 213e reaching a portion of a surface of an emitter electrode 201c, 202, respectively. Resist pattern 250a is then removed.

Figure 37:
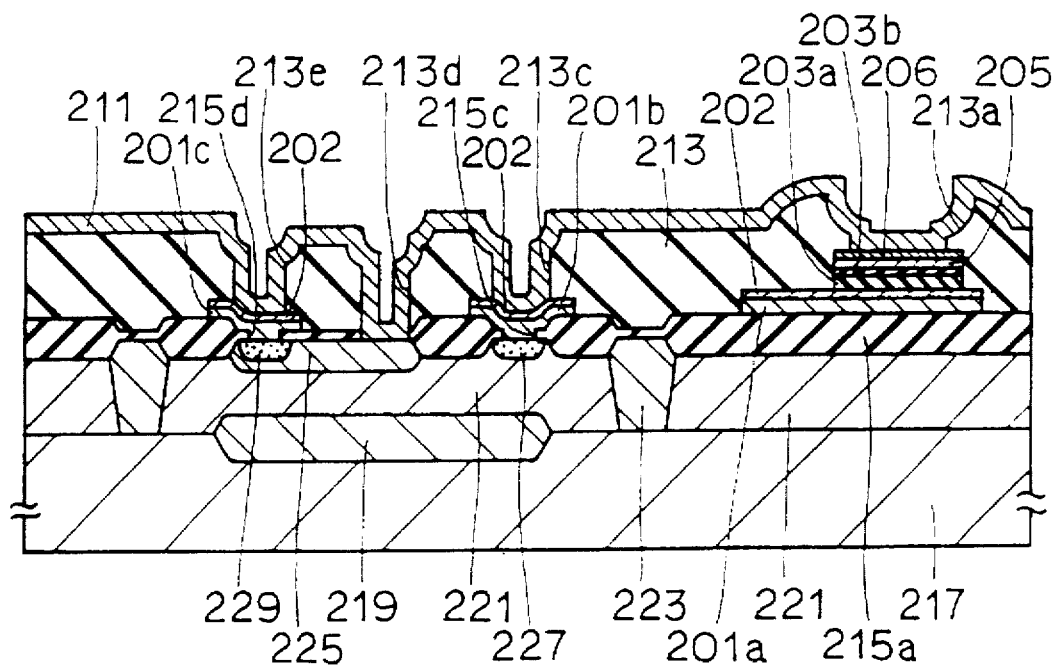

Referring to FIG. 37, aluminum silicon layer 211 is formed entirely on the surface by sputtering.

Figure 38:
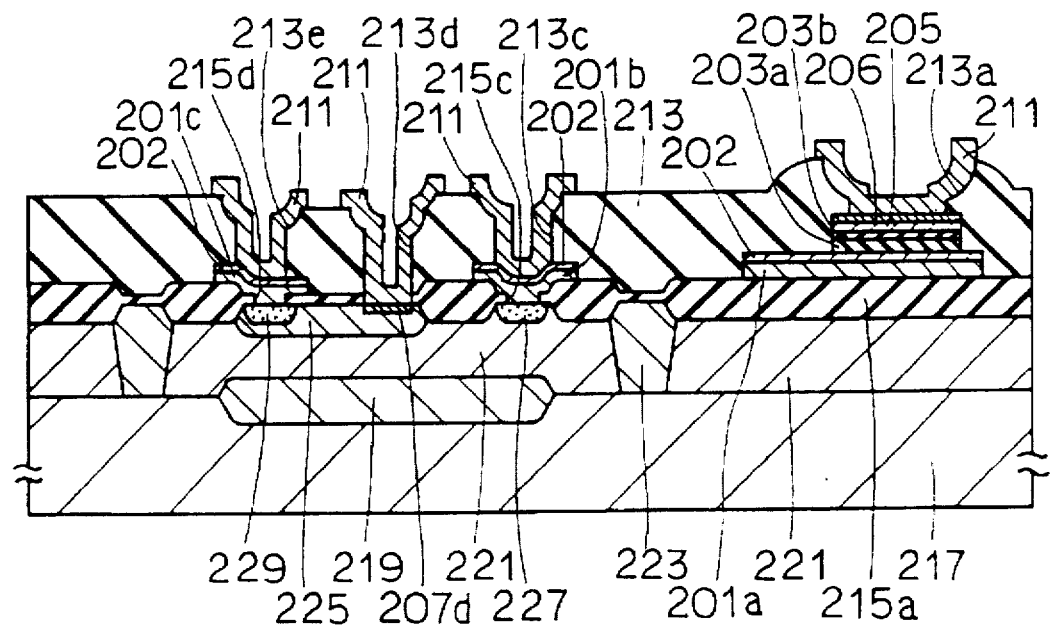

Referring to FIG. 38, aluminum silicon layer 211 is patterned to a desired shape by photolithography so as to form interconnection layer 211 which is in contact with each of the underlying layers through contact holes 213a, 213c, 213d, and 213e, respectively.

In the present embodiment, the upper electrode forming the capacitor has non-doped polycrystalline silicon film 205 and silicide layer 206. As a result, the capacitor structure of the present embodiment has capacitance and breakdown voltage which are superior to those of the conventional capacitor structure shown in FIG. 39. Accordingly, the capacitor structure of the present embodiment is not likely to operate inaccurately even when the degree of integration is increased.

Furthermore, in the present embodiment, a lower electrode forming the capacitor has a stacked structure of doped polycrystalline silicon film 201a and silicide layer 202, instead of an impurity region formed on the surface of a substrate. Accordingly, the capacitance is maintained to a constant value even when a relatively high voltage is applied between the electrodes forming the capacitor. Therefore, a stable operation can be obtained even when the capacitor structure of the present embodiment is applied to a device in which a relatively high voltage is employed.

Since the capacitor insulating layer is formed of a stacked structure of three layers including silicon oxide film 203c, silicon nitride film 203a, and silicon oxide film 203b, it is possible to obtain increased capacitance and breakdown voltage in the present embodiment as well as in the third embodiment.

In addition, since the lower electrode forming the capacitor has a stacked structure of two layers including doped polycrystalline silicon film 201a and silicide layer 202, capacitor which contributes even more to an increased capacitance is obtained in the present embodiment as well as in the fourth embodiment.

In the first to sixth embodiments, respective silicide layers are not limited to titanium silicide. They may also be of tungsten silicide ($WSi_2$), molybdenum silicide ($MoSi_2$), or platinum silicide ($PtSi_2$).

When a platinum silicide is used for the silicide layer, a platinum layer 109 is formed entirely on the surface by sputtering in a process shown in FIG. 8. Heat treatment is effected with a temperature of 600° C. for 30 minutes. Thus, platinum silicide layers 107a, 107b, 107c, 107d and 107e are formed. The platinum is then removed.

In the first to fifth embodiments, barrier layers 109 or 209 are provided between the lower electrode forming the capacitor and the layer including aluminum (for example, aluminum layer 111 or aluminum silicon layer 211), and between interlayer insulating film 113 or 213 and the layer including aluminum. This barrier layer 109 or 209 serves to improve the adhesiveness of the layer including aluminum to the interlayer insulating film while preventing alloy spikes caused by a direct contact between the layer including aluminum and a layer including silicon (for example, silicide layer 107a or 207a).

Barrier layer 109 or 209 in the first to fifth embodiments is not limited to titanium nitride. Any material may be used as long as it forms a silicide with silicon while not giving rise to any alloy spike, and has satisfactory adhesiveness with a silicon oxide film.

Although the capacitor insulating layer was described in conjunction with a stacked structure of two layers including silicon nitride film and silicon oxide film, or three layers including silicon oxide film, silicon nitride film, and silicon oxide film in the first to sixth embodiments, it is not limited to the above structure. Any material may be used as long as it can provide insulation between the two capacitor electrodes.

In addition, the lower electrode forming the capacitor is not limited to an impurity region formed on the surface of the substrate, doped polycrystalline silicon film, or a stacked structure of doped polycrystalline silicon film and silicide layer. It may be a conductive material other than described above.

Based on the foregoing, in the semiconductor device of the present invention, a capacitor with excellent capacitance and breakdown voltage can be obtained. Accordingly, it is possible to implement a capacitor which is not likely to operate inaccurately even when the degree of integration is made higher.

In the semiconductor device in accordance with the preferred aspect of the present invention, the lower electrode has a second polycrystalline silicon layer to which an impurity is introduced so that large capacitance of the capacitor can be maintained even when a high voltage is applied between the electrodes.

In the semiconductor device in accordance with another preferred aspect of the present invention, the lower electrode has a polycrystalline silicon layer and a silicide layer to which an impurity is introduced, so that it is possible to obtain a capacitor which can contribute even more to an increased capacitance.

In the semiconductor device in accordance with yet another preferred aspect of the present invention, the capacitor insulating layer has a stacked structure of two layers including a silicon nitride film and a first silicon oxide film, so that a capacitor with large capacitance and high breakdown voltage can be obtained.

In the semiconductor device in accordance with yet another preferred aspect of the present invention, the capacitor insulating layer has a second silicon oxide film formed between the lower electrode layer and the silicon nitride film of the capacitor insulating layer so that a capacitor with an excellent capacitor breakdown voltage can be obtained.

In the semiconductor device in accordance with yet another preferred aspect of the present invention, the interconnection layer has a barrier layer formed between the silicide layer of the upper electrode and the layer including aluminum so that it is possible to avoid alloy spikes caused by a direct contact between the layer including aluminum and the layer including silicon.

In the manufacturing method of the present invention, a capacitor can be manufactured which has excellent capacitance and breakdown voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a lower electrode layer;
   a capacitor insulating layer formed on said lower electrode layer;
   an upper electrode formed on said capacitor insulating layer to be insulated from said lower electrode layer; wherein
   said upper electrode layer has a polycrystalline silicon layer which is in contact with said capacitor insulating layer, a silicide layer formed on said polycrystalline silicon layer, and said polycrystalline silicon layer contains substantially no impurities.

2. The semiconductor device in accordance with claim 1, further comprising a semiconductor substrate having a main surface, wherein
   said lower electrode layer has a second polycrystalline silicon layer to which an impurity is introduced and is formed on the main surface of said semiconductor substrate.

3. The semiconductor device in accordance with claim 2, wherein
   said lower electrode layer has a second silicide layer formed on said second polycrystalline silicon layer.

4. The semiconductor device in accordance with claim 1, wherein
   said capacitor insulating layer has a silicon nitride film and a first silicon oxide film formed on said silicon nitride film.

5. The semiconductor device in accordance with claim 4, wherein
   said capacitor insulating layer further has a second silicon oxide film formed between said lower electrode layer and said silicon nitride film.

6. The semiconductor device in accordance with claim 1, further comprising an interconnection layer connected to said upper electrode layer, wherein
   said interconnection layer has a barrier layer and a layer including aluminum connected electrically to said silicide layer; and
   said barrier layer is formed between said silicide layer and said layer including aluminum.

7. The semiconductor device in accordance with claim 1, wherein
   said capacitor insulating layer is formed of a single layer of silicon nitride film.

8. The semiconductor device in accordance with claim 1, further comprising
   a semiconductor substrate having a main surface, wherein
   said lower electrode includes an impurity region formed at the main surface of said semiconductor substrate.

9. The semiconductor device in accordance with claim 1, wherein
   said silicide layer has a layer of at least one material selected from the group consisting of titanium silicide ($TiSi_2$), tungsten silicide ($WSi_2$), molybdenum silicide ($MoSi_2$), and platinum silicide ($PtSi_2$).

10. The semiconductor device in accordance with claim 6, wherein
    said barrier layer includes an titanium nitride layer.

* * * * *